(12) United States Patent
Lin et al.

(10) Patent No.: US 12,328,903 B2
(45) Date of Patent: Jun. 10, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chieh-Ning Feng, Taichung (TW); Hsiaowen Lee, Hsinchu (TW); Ming-Ching Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 517 days.

(21) Appl. No.: 17/672,404

(22) Filed: Feb. 15, 2022

(65) Prior Publication Data
US 2023/0067859 A1   Mar. 2, 2023

Related U.S. Application Data

(63) Continuation-in-part of application No. 17/460,204, filed on Aug. 28, 2021, now Pat. No. 12,040,359.

(51) Int. Cl.
*H01L 29/423* (2006.01)
*H01L 21/762* (2006.01)
(Continued)

(52) U.S. Cl.
CPC ... *H10D 30/6735* (2025.01); *H01L 21/76224* (2013.01); *H10D 30/031* (2025.01);
(Continued)

(58) Field of Classification Search
CPC ......... H01L 29/42392; H01L 21/76224; H01L 21/823412; H01L 21/823468; H01L 29/0649; H01L 29/0665; H01L 29/66545; H01L 29/6656; H01L 29/66742; H01L 29/78696; H01L 21/823481; H01L 27/088;
(Continued)

(56) References Cited

U.S. PATENT DOCUMENTS

2017/0117375 A1   4/2017   Kim et al.
2018/0294331 A1   10/2018  Cho et al.
(Continued)

*Primary Examiner* — Tong-Ho Kim
(74) *Attorney, Agent, or Firm* — FOLEY & LARDNER LLP

(57) ABSTRACT

A semiconductor device includes a plurality of first channel layers vertically spaced from one another and a plurality of second channel layers vertically spaced form one another. Each of the plurality of first and second channel layers extend along a first lateral direction. The semiconductor device includes an isolation structure disposed between the plurality of first channel layers and the plurality of second channel layers along a second lateral direction perpendicular to the first lateral direction. The semiconductor device includes a plurality of inner spacers discretely disposed along a first sidewall of the isolation structure that faces toward the first lateral direction, or discretely disposed along a second sidewall of the isolation structure that faces away from the first lateral direction wherein an interface between each of the plurality of inner spacers and the first or second sidewall has a vertical profile.

17 Claims, 23 Drawing Sheets

(51) Int. Cl.
  *H01L 21/8234* (2006.01)
  *H01L 29/06* (2006.01)
  *H01L 29/66* (2006.01)
  *H01L 29/786* (2006.01)
  *H10D 30/01* (2025.01)
  *H10D 30/67* (2025.01)
  *H10D 62/10* (2025.01)
  *H10D 64/01* (2025.01)
  *H10D 84/01* (2025.01)
  *H10D 84/03* (2025.01)

(52) U.S. Cl.
  CPC ....... *H10D 30/6757* (2025.01); *H10D 62/115* (2025.01); *H10D 62/118* (2025.01); *H10D 64/017* (2025.01); *H10D 64/021* (2025.01); *H10D 84/0128* (2025.01); *H10D 84/0147* (2025.01); *H10D 84/038* (2025.01)

(58) Field of Classification Search
  CPC ........... H01L 29/0673; H01L 29/66439; H01L 29/775; B82Y 10/00
  USPC .......................................................... 257/24
  See application file for complete search history.

(56) References Cited

U.S. PATENT DOCUMENTS

| | | |
|---|---|---|
| 2019/0006485 A1 | 1/2019 | Kim et al. |
| 2019/0237559 A1 | 8/2019 | Cheng et al. |
| 2020/0105761 A1* | 4/2020 | Liaw ................. H01L 21/02603 |
| 2020/0185539 A1* | 6/2020 | Lee ..................... H01L 29/0653 |
| 2020/0328208 A1* | 10/2020 | Chiang ............. H01L 29/66545 |
| 2020/0365692 A1 | 11/2020 | Jung et al. |

* cited by examiner

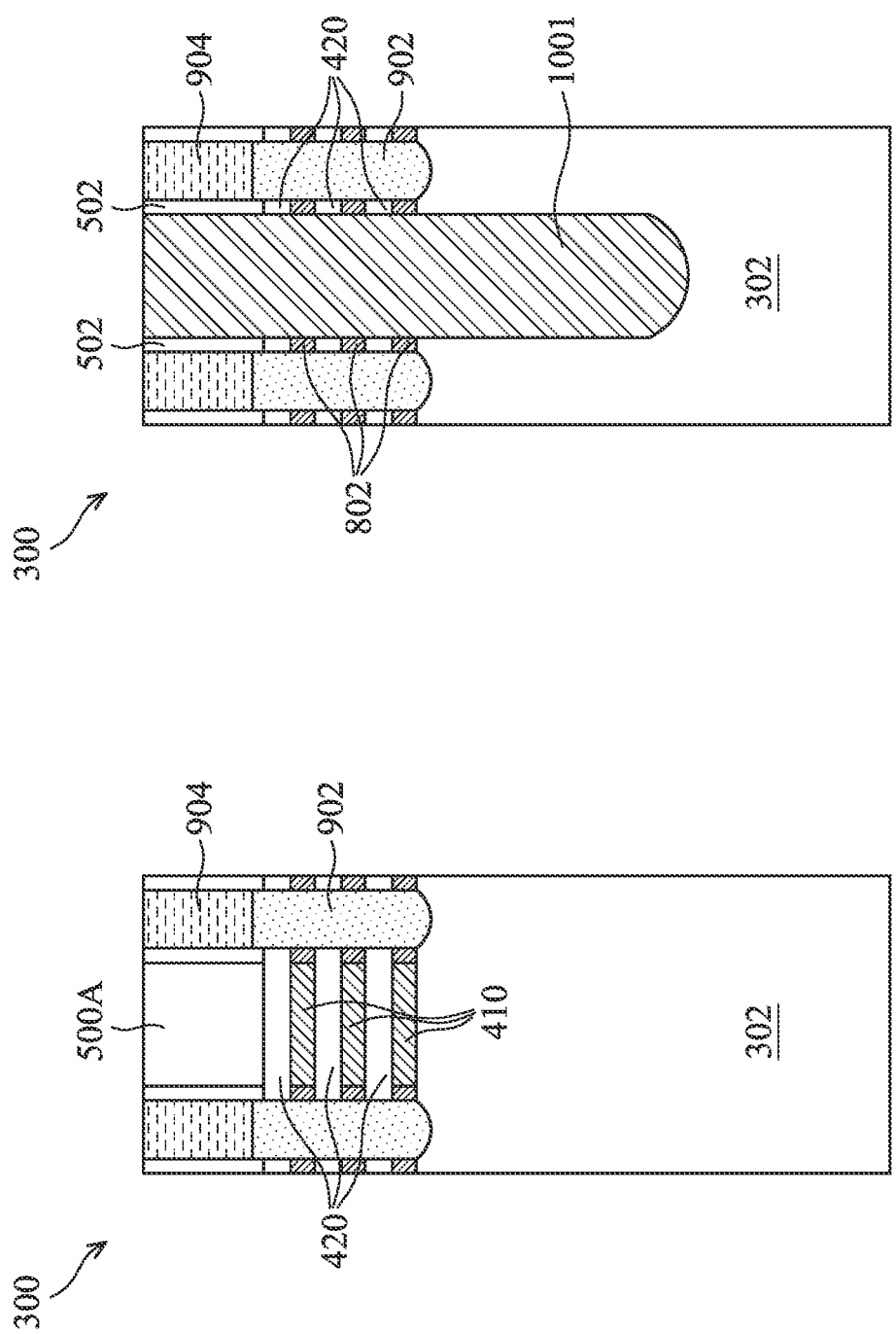

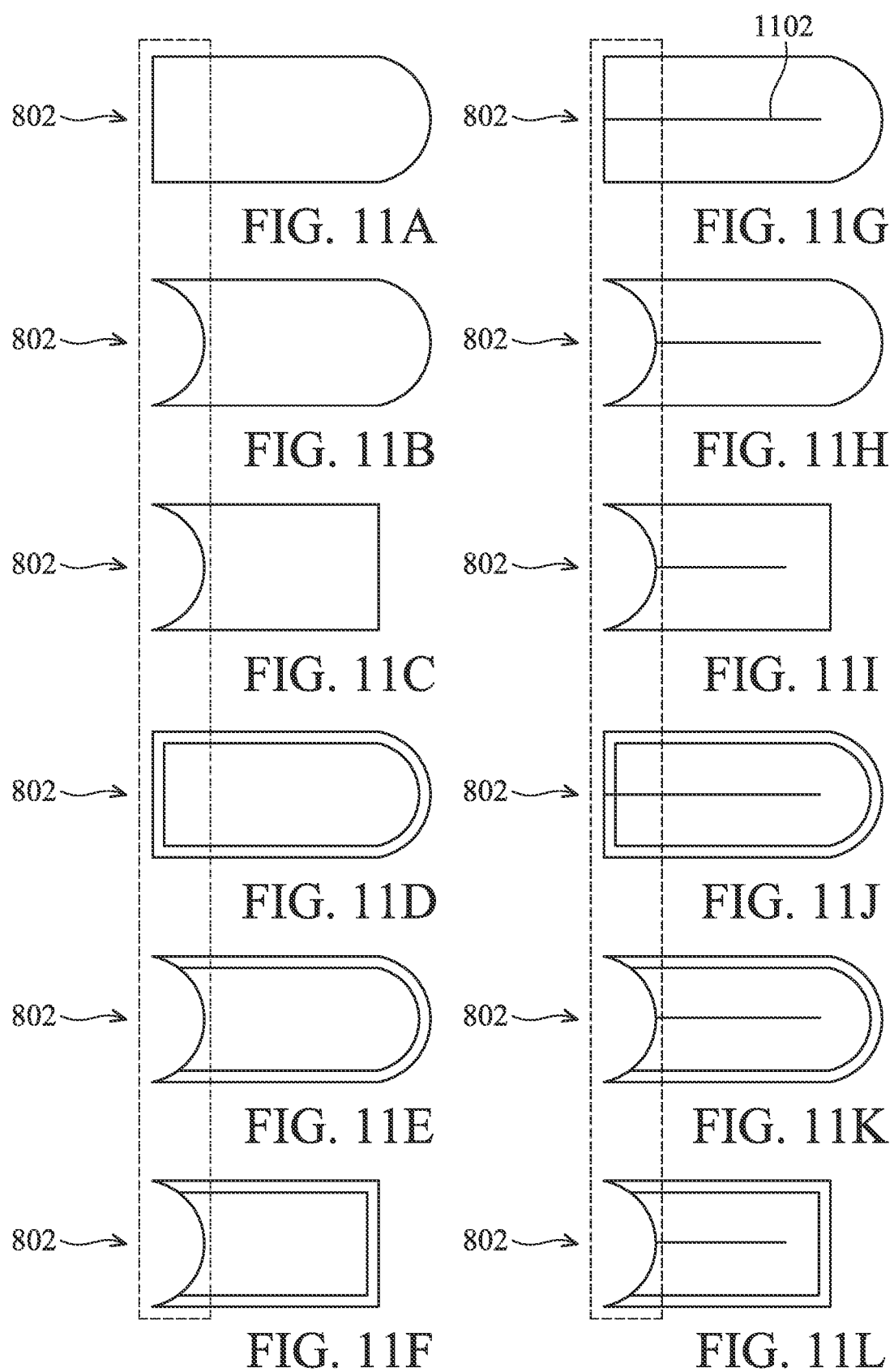

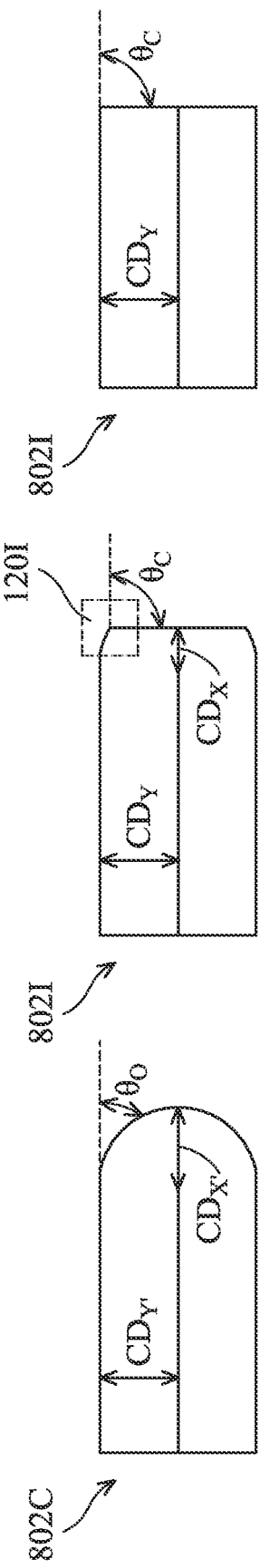
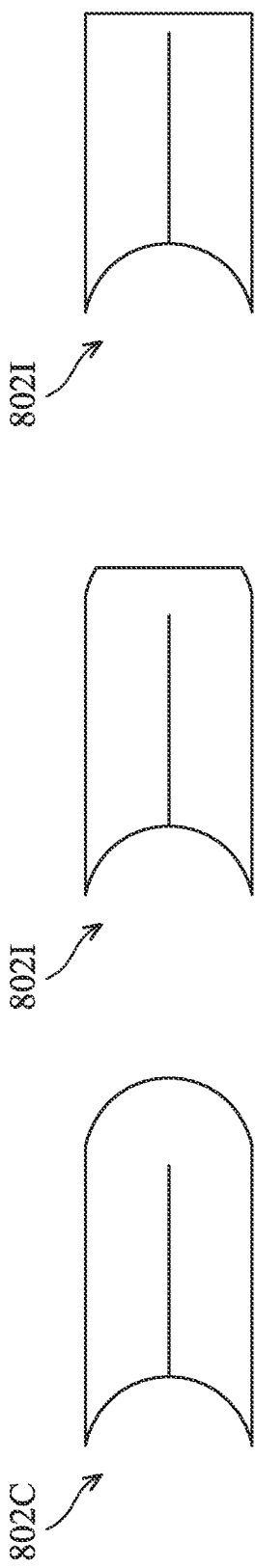
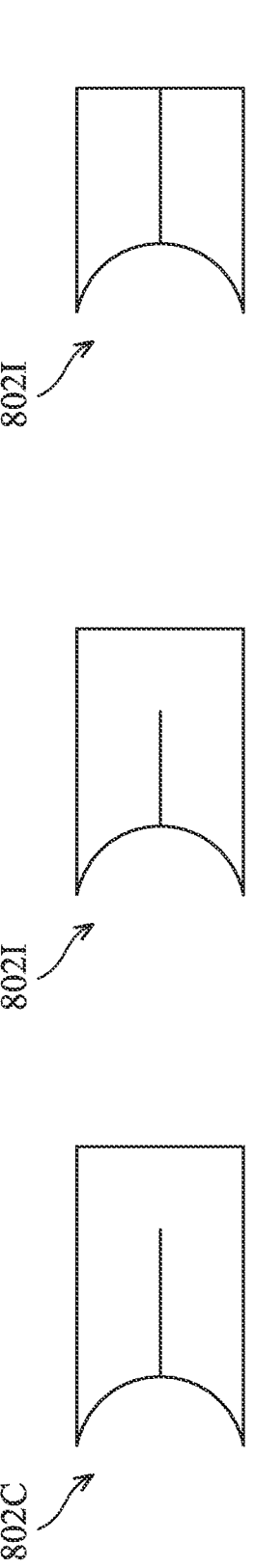
FIG. 12A FIG. 12B FIG. 12C
FIG. 12D FIG. 12E FIG. 12F
FIG. 12G FIG. 12H FIG. 12I

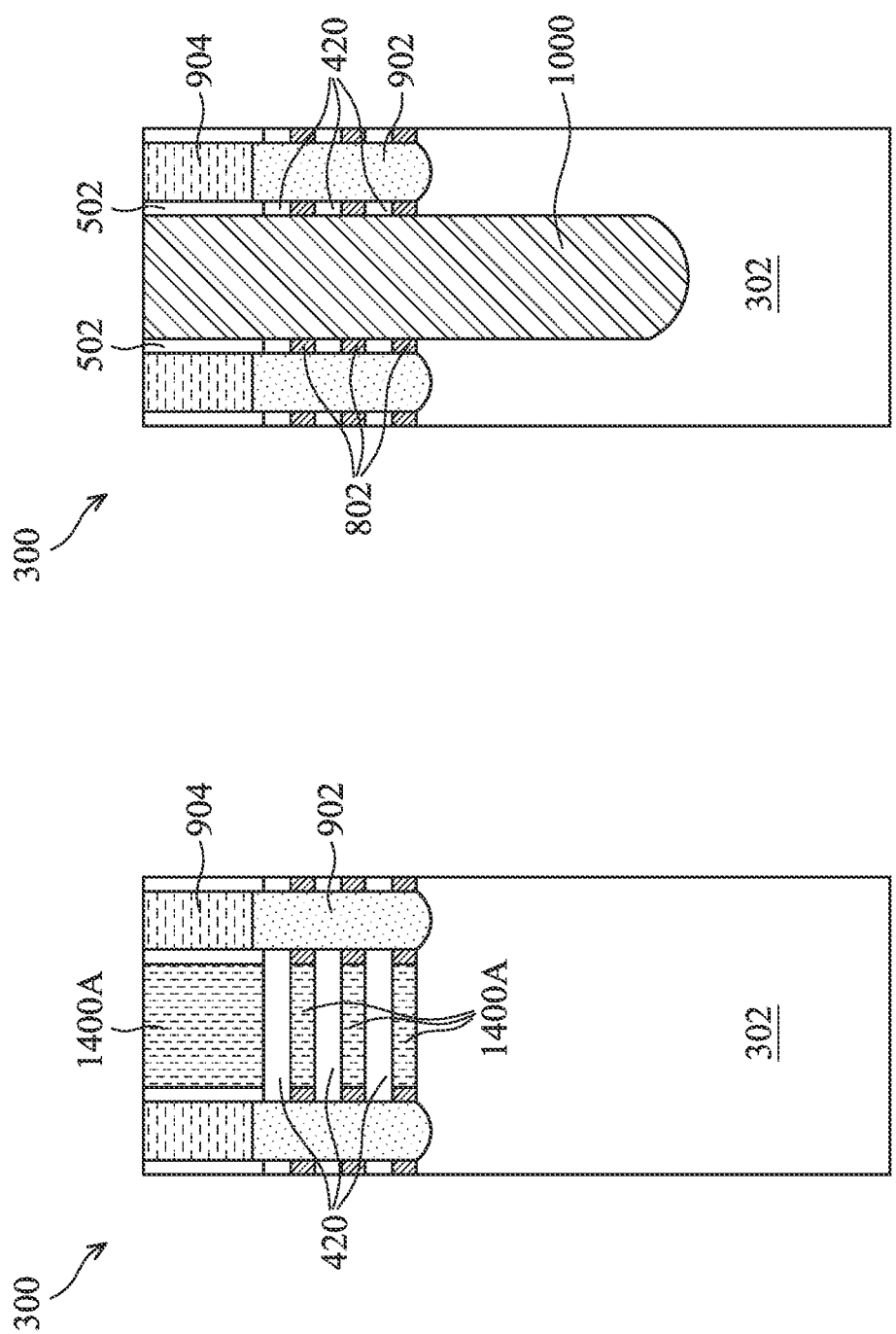

SEMICONDUCTOR DEVICES AND METHODS OF MANUFACTURING THEREOF

CROSS-REFERENCE TO RELATED APPLICATION

This application is related to and claims priority under 35 U.S. § 120 as a continuation-in-part of U.S. Utility application Ser. No. 17/460,204, filed on Aug. 28, 2021, titled "SEMICONDUCTOR DEVICES AND METHODS OF MANUFACTURING THEREOF," the entire contents of which are incorporated herein by reference for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 6, 7A, 7B, 8, 9A, 9B, 10A, 10B, 10C, 11A, 11B, 11C, 11D, 11E, 11F, 11G, 11H, 11I, 11J, 11K, 11L, 12A, 12B, 12C, 12D, 12E, 12F, 12G, 12H, 12I, 12J, 13A, 13B, 13C, 13D, 13E, 14A, 14B, and 14C illustrate cross-sectional or top views of an example GAA FET device (or a portion of the example GAA FET device) during various fabrication stages, made by the method of FIG. 2, in accordance with some embodiments.

DETAILED DESCRIPTION

Figure 1:
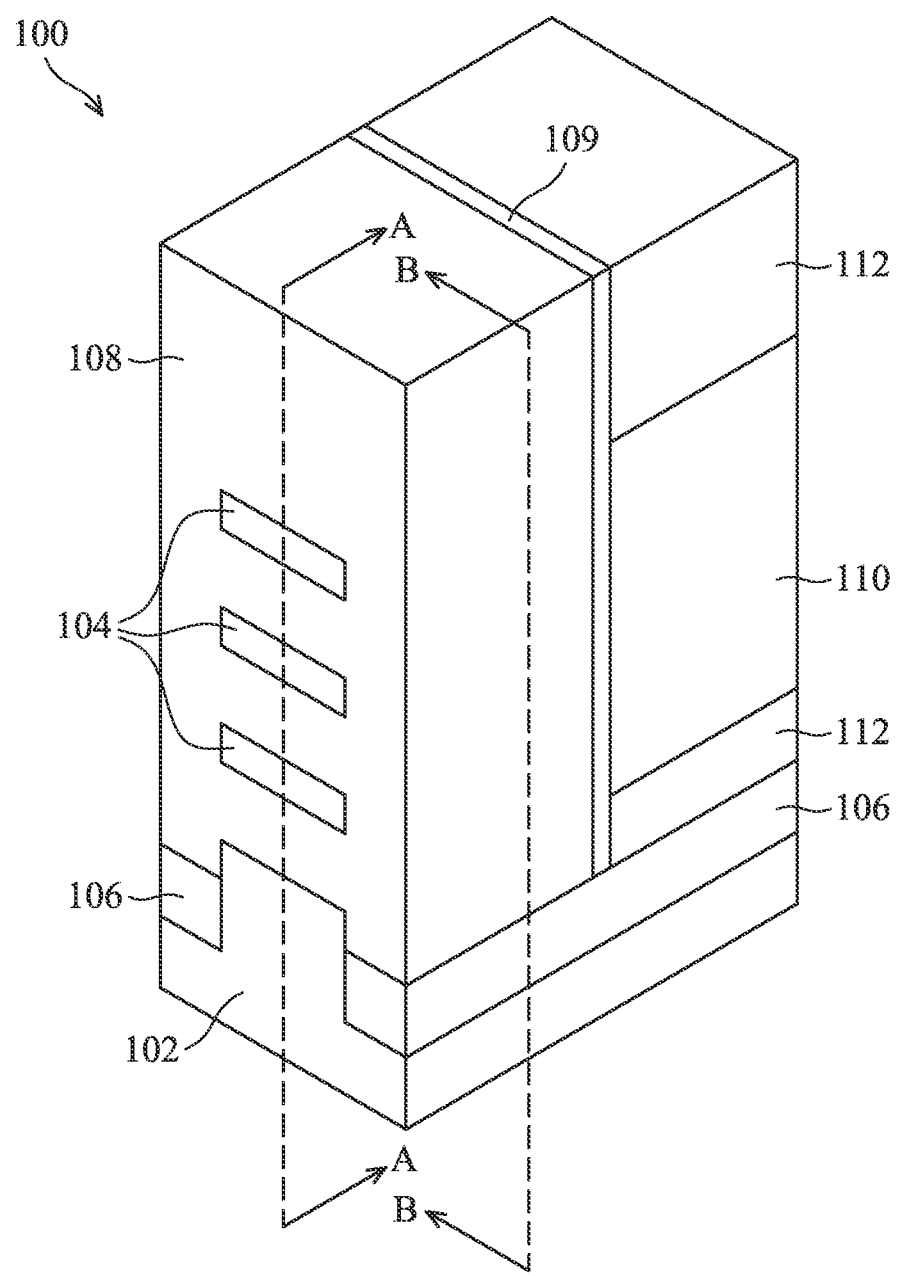
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors, can provide increased device density and increased performance over planar transistors. Some advanced non-planar transistor device architectures, such as nanostructure transistors, can further increase the performance over fin-based transistors. Example nanostructure transistors include nanosheet transistors, nanowire transistors, gate-all-around (GAA) transistors, and the like. The nanostructure transistor includes one or more nanostructures, collectively configured as a conduction channel of the transistor, that are fully wrapped by a gate structure. When compared to the fin-based transistors where the channel is partially wrapped by a gate structure, the nanostructure transistor, in general, can include one or more gate stacks that wrap around the full perimeter of a nanostructure channel. In some embodiments, the gate stack partially wrap around the nanostructure channel. As such, control over the nanostructure channel may be further improved, thus causing, for example, a relatively large driving current given the similar size of the fin-based transistor and nanostructure transistor.

An integrated circuit typically includes a large number of such nanostructure transistors disposed over a substrate. To configure these nanostructure transistors operating as certain circuits, some of the nanostructure transistors can be operatively connected to or disconnected from each other. For example, plural (intermediate) channel structures of nanostructure transistors may be formed over a substrate, which are arranged in parallel with one another. A (e.g., dummy) gate structure is next formed over these channel structures. Prior to replacing the dummy gate structure with an active (e.g., metal) gate structure, at least a portion of a middle one of the channel structures, which is designed to decouple side ones of the channel structures, is replaced with a dielectric material, thereby forming an isolations structure. As such, transistors, respectively formed based on the side channel structures, can be electrically decoupled from each other with the isolation structure.

In existing technologies, when removing the middle channel structure (or more specifically, the semiconductor layers of the middle channel structure), a number of inner spacers vertically disposed between adjacent semiconductor channel layers of the middle channel structure typically remain substantially intact. Such intact inner spacers can present a sidewall protruding toward a cavity formed by removing the middle channel structure. The cavity is then filled with a dielectric material to form an isolation structure. With these protruded inner spacers, a (e.g., lower) portion of the middle channel structure may not be removed as desired. For example, one or more of the semiconductor layers of the middle channel structure relatively close to the bottom may remain. Stated another way, the cavity may have some portions of the semiconductor layers left. As such, the isolation structure, formed by filling the cavity with a dielectric material, may not successfully isolate the transistor formed by the side channel structures, respectively, as originally planned.

Embodiments of the present disclosure are discussed in the context of forming non-planar transistor devices (e.g., nanostructure transistor devices), and in particular, in the context of forming an isolation structure between two adjacent channel structures. Different from the existing technologies, the disclosed method provides shaping the sidewalls of inner spacers on a side facing a (e.g., middle) channel structure between the two adjacent channel structures, in which the middle channel structure defines a footprint of the to-be-formed isolation structure. The step of shaping the sidewalls may be performed concurrently with removing the middle channel structure. In various embodiments, the sidewalls may be each shaped to present a nearly vertical profile. With a majority portion of the protruded sidewall being removed, it can be more efficiently to form the isolation structure without any semiconductor layers remaining therein. As such, the transistors, formed by the adjacent channel structures, respectively, can be more reliably decoupled from each other by the isolation structure.

FIG. 1 illustrates a perspective view of an example non-planar (e.g., GAA) transistor device 100, in accordance with various embodiments. The non-planar transistor device 100 includes a substrate 102 and a number of semiconductor layers (e.g., nanosheets, nanowires, or otherwise nanostructures) 104 above the substrate 102. The semiconductor layers 104 are vertically separated from one another, which can collectively function as a (conduction) channel of the GAA FET device 100. Isolation regions 106 are formed on opposing sides of a protruded portion of the substrate 102, with the semiconductor layers 104 disposed above the protruded portion. A gate structure 108 wraps around each of the semiconductor layers 104 (e.g., a full perimeter of each of the semiconductor layers 104). A gate spacer 109 extends along each sidewall of the gate structure 108. Source/drain structures are disposed on opposing sides of the gate structure 108 with the gate spacer 109 disposed therebetween, e.g., source/drain structure 110 shown in FIG. 1. An interlayer dielectric (ILD) 112 is disposed over the source/drain structure 110.

The GAA FET device shown in FIG. 1 is simplified, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis (e.g., a lengthwise direction) of the semiconductor (channel) layers 104 and in a direction of a current flow between the source/drain structures; and cross-section B-B is cut along a longitudinal axis (e.g., a lengthwise direction) of the gate structure 108. In some arrangements, cross-section A-A and cross-section B-B may be perpendicular to each other. Subsequent figures refer to these reference cross-sections for clarity.

Figure 2:
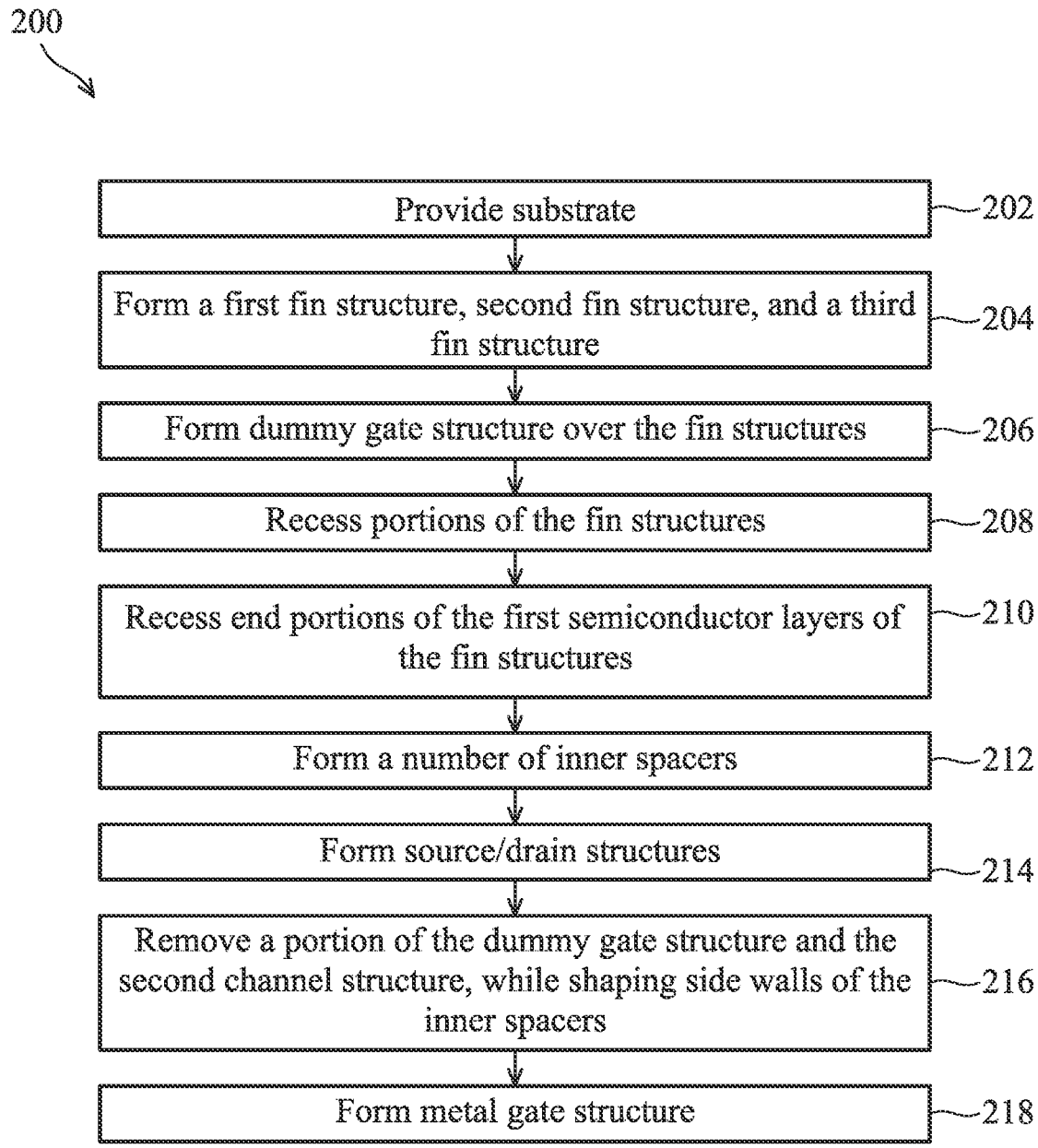
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional or top views of at least a portion of an example GAA FET device at various fabrication stages as shown in FIGS. 3, 4A, 4B, 5A, 5B, 6, 7A, 7B, 8, 9A, 9B, 10A, 10B, 10C, 11A, 11B, 11C, 11D, 11E, 11F, 11G, 11H, 11I, 11J, 11K, 11L, 12A, 12B, 12C, 12D, 12E, 12F, 12G, 12H, 12I, 12J, 13A, 13B, 13C, 13D, 13E, 14A, 14B, and 14C, respectively, which will be discussed in further detail below.

In brief overview, the method 200 starts with operation 202 of providing a substrate. The method 200 continues to operation 204 of forming a first fin structure, a second fin structure, and a third fin structure. Each of the first to third fin structures includes a number of first semiconductor layers (which serve as sacrificial layers) and a number of second semiconductor layers (which serve as channel layers), in some embodiments. The method 200 continues to operation 206 of forming a dummy gate structure over the first to third fin structures. Next, the method 200 continues to operation 208 of recessing portions of each of the first to third fin structures. The method 200 then proceeds to operation 210 of recessing end portions of the first semiconductor layers of each of the first to third fin structures, thereby forming a first channel structure, a second channel structure, and a third channel structure, respectively. Next, the method 200 continues to operation 212 of forming a number of first inner spacers along sidewalls of the first channel structure, a number of second inner spacers along sidewalls of the second channel structure, and a number of third inner spacers along sidewalls of the third channel structure. Next, the method 200 proceeds to operation 214 of forming first source/drain structures along the sidewalls of the first channel structure, second source/drain structures along the sidewalls of the second channel structure, and third source/drain structures along the sidewalls of the third channel structure. The method 200 proceeds to operation 216 of removing a portion of the dummy gate structure and the second channel structure, while shaping sidewalls of the second inner spacers. Then, the method 200 continues to operation 218 of forming a first metal gate structure and a second metal gate structure.

As mentioned above, FIGS. 3-14C each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Figure 3:
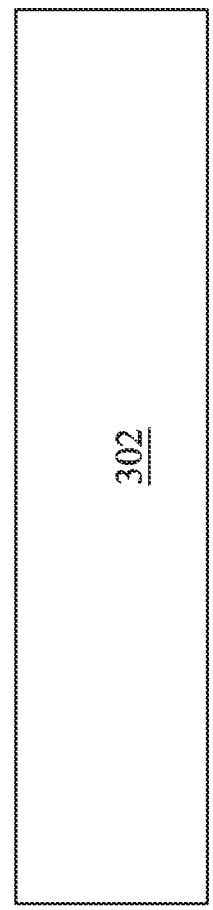

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction along the lengthwise direction of a number of channel layers of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4A:
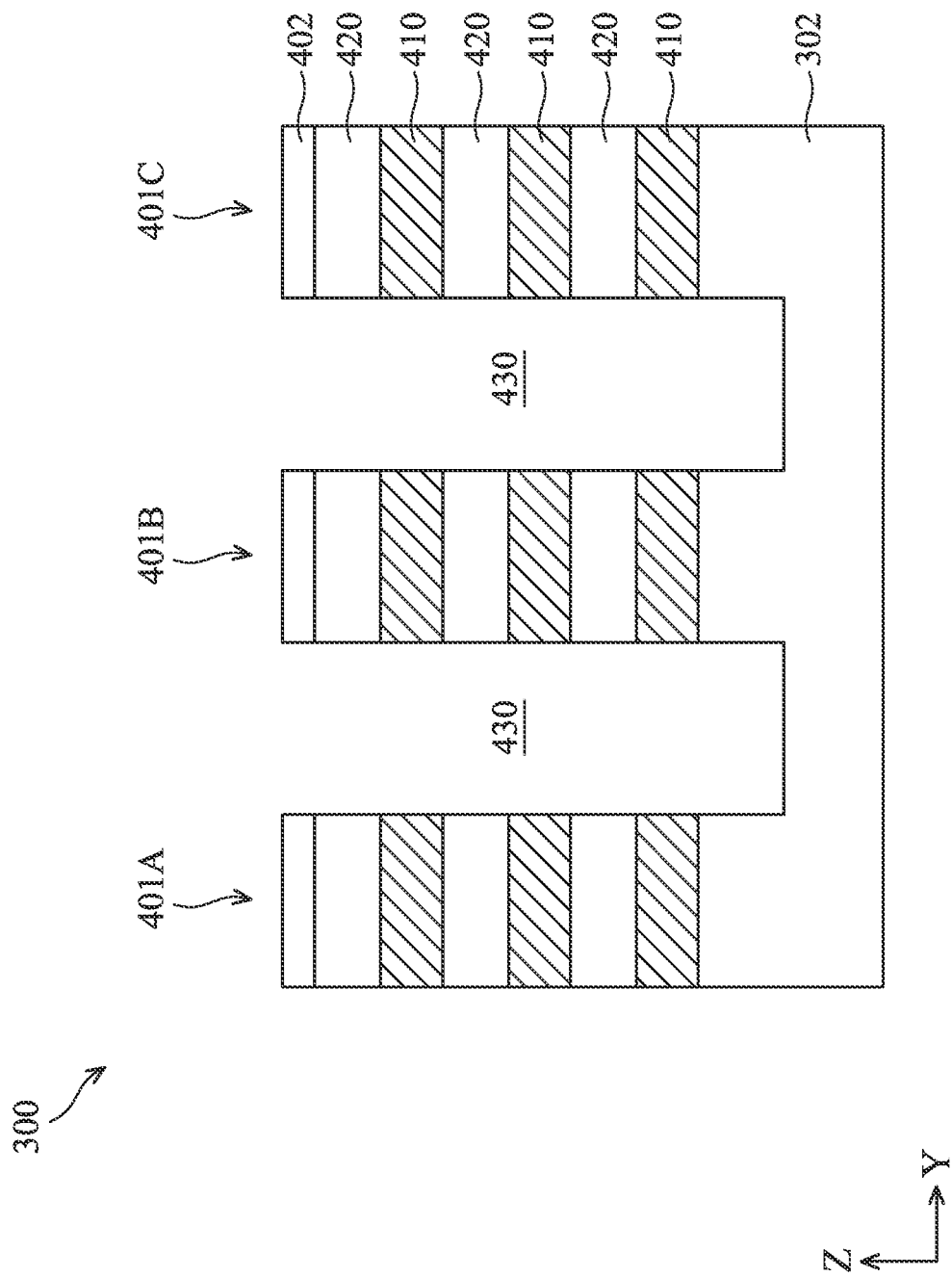
Figure 4B:
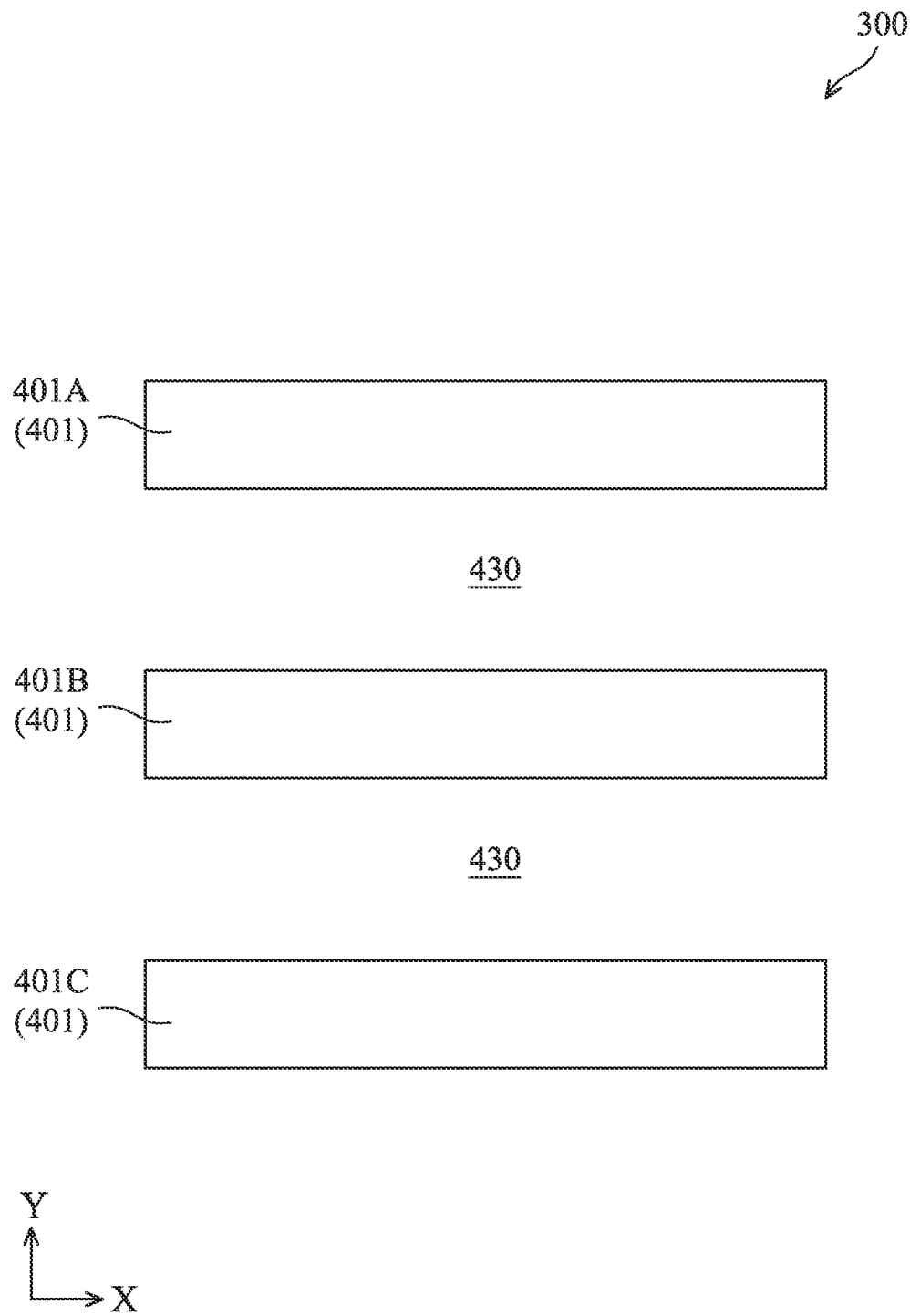

Corresponding to operation 204 of FIG. 2, FIG. 4A is a cross-sectional view of the GAA FET device 300 including a number of fin structures 401A, 401B, and 401C formed over the substrate 302 at one of the various stages of fabrication. The cross-sectional view of FIG. 4A is cut in a direction perpendicular to the lengthwise direction of a number of channel layers of the GAA FET device 300 (e.g., cross-section B-B indicated in FIG. 1). The fin structures 401A to 401C may sometimes be collectively referred to as fin structure 401 in the following discussions. Further, FIG. 4B illustrates a top view of the GAA FET device 300 at the stage of fabrication that corresponds to operation 204.

To form the fin structure 401, a number of first semiconductor layers 410 and a number of second semiconductor layers 420 are alternatingly disposed (e.g., deposited) on top of one another to first form a stack. For example, one of the second semiconductor layers 420 is disposed over one of the first semiconductor layers 410 then another one of the first semiconductor layers 420 is disposed over the second semiconductor layer 410, so on and so forth. The first and second stacks may include any number of alternately disposed first and second semiconductor layers 410 and 420, respectively. For example in FIG. 4A, the stack includes 3 first semiconductor layers 410, with 3 second semiconductor layers 420 alternatingly disposed therebetween and with one of the second semiconductor layers 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 420 (e.g., of silicon).

In various embodiments, the semiconductor layers 420 may be intentionally doped. For example, when the GAA FET device 300 is configured as an n-type transistor (and operates in an enhancement mode), each of the semiconductor layers 420 may be silicon that is doped with a p-type dopant such as boron (B), aluminum (Al), indium (In), and gallium (Ga); and when the GAA FET device 300 is configured as a p-type transistor (and operates in an enhancement mode), each of the semiconductor layers 420 may be silicon that is doped with an n-type dopant such as phosphorus (P), arsenic (As), antimony (Sb). In another example, when the GAA FET device 300 is configured as an n-type transistor (and operates in a depletion mode), each of the semiconductor layers 420 may be silicon that is doped with an n-type dopant instead; and when the GAA FET device 300 is configured as a p-type transistor (and operates in a depletion mode), each of the semiconductor layers 420 may be silicon that is doped with a p-type dopant instead. In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 (e.g., as a stack) on the semiconductor substrate 302, the stack may be patterned to form one or more fin structures (e.g., fin structures 401A to 401C shown in FIGS. 4A-B). As further shown in the top view of FIG. 4B, each of the fin structures 401A to 401C is elongated along a lateral direction (e.g., the X-direction). And as shown in FIG. 4A, each of the fin structures 401A to 401C includes a stack of patterned semiconductor layers 410-420 interleaved with each other. The fin structures 401A to 401C are formed by patterning the stack of semiconductor layers 410-420 and the semiconductor substrate 302 using, for example, photolithography and etching techniques. Portions of the semiconductor layers 420 may collectively function as a conduction channel of the GAA FET device 300, and the semiconductor layers 410 may be later removed and replaced with a portion of an active gate structure that wraps around each of the semiconductor layers 420. Accordingly, the semiconductor layers 410 and 420 may sometimes be referred to as sacrificial layers 410 and channel layer 420, respectively.

For example, a mask layer 402 (which can include multiple layers such as, for example, a pad oxide layer and an overlying hardmask layer) is formed over the topmost semiconductor layer (e.g., 420 in FIG. 4A). The pad oxide layer may be a thin film comprising silicon oxide formed, for example, using a thermal oxidation process. The pad oxide layer may act as an adhesion layer between the topmost semiconductor layer 420 and the hardmask layer 402. In some embodiments, the hardmask layer may include silicon nitride, silicon oxynitride, silicon carbonitride, the like, or combinations thereof. In some other embodiments, the hardmask layer may include a material similar as a material of the semiconductor layers 410/420 such as, for example, $Si_{1-y}Ge_y$, Si, etc., in which the molar ratio (y) may be different from or similar to the molar ratio (x) of the semiconductor layers 410. The hardmask layer may be formed over the stack (i.e., before pattering the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form one or more of the fin structures 410, thereby defining trenches 430 (or openings) between adjacent fin structures 401. When multiple fin structures are formed, such a trench 430 may be disposed between any adjacent ones of the fin structures 401. In some embodiments, the fin structure 401 is formed by etching trenches in the semiconductor layers 410-420 and substrate 302 using, for example, reactive ion etch (ME), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the fin structure 401.

Figure 5A:
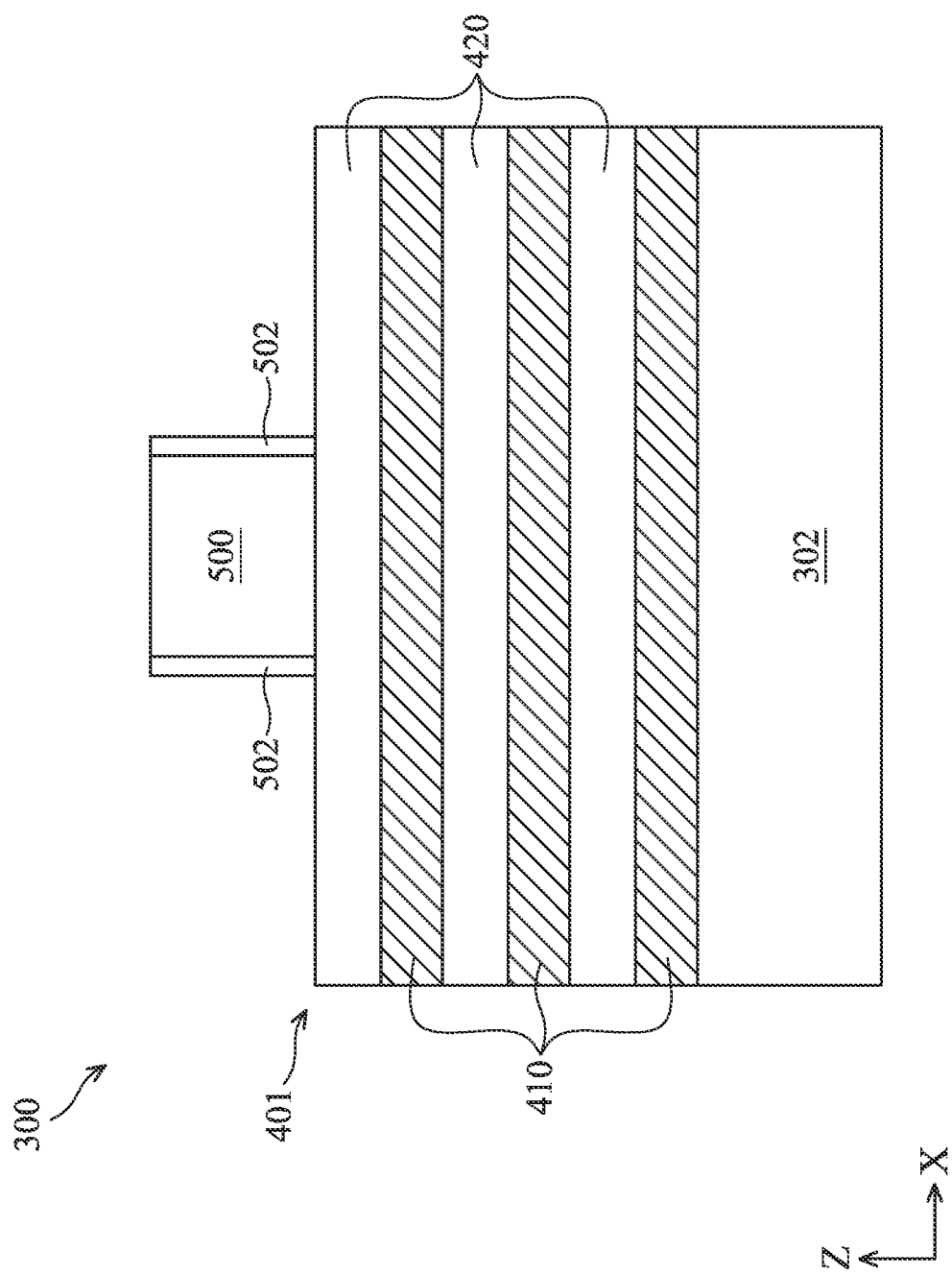

Corresponding to operation 206 of FIG. 2, FIG. 5A is a cross-sectional view of the GAA FET device 300 including a dummy gate structure 500, at one of the various stages of fabrication. The cross-sectional view of FIG. 5A is cut in a direction along the lengthwise direction of a number of channel layers of the GAA FET device 300 (e.g., cross-section A-A indicated in FIG. 1). Further, FIG. 5B illustrates a top view of the GAA FET device 300 at the stage of fabrication that corresponds to operation 206.

Figure 5B:
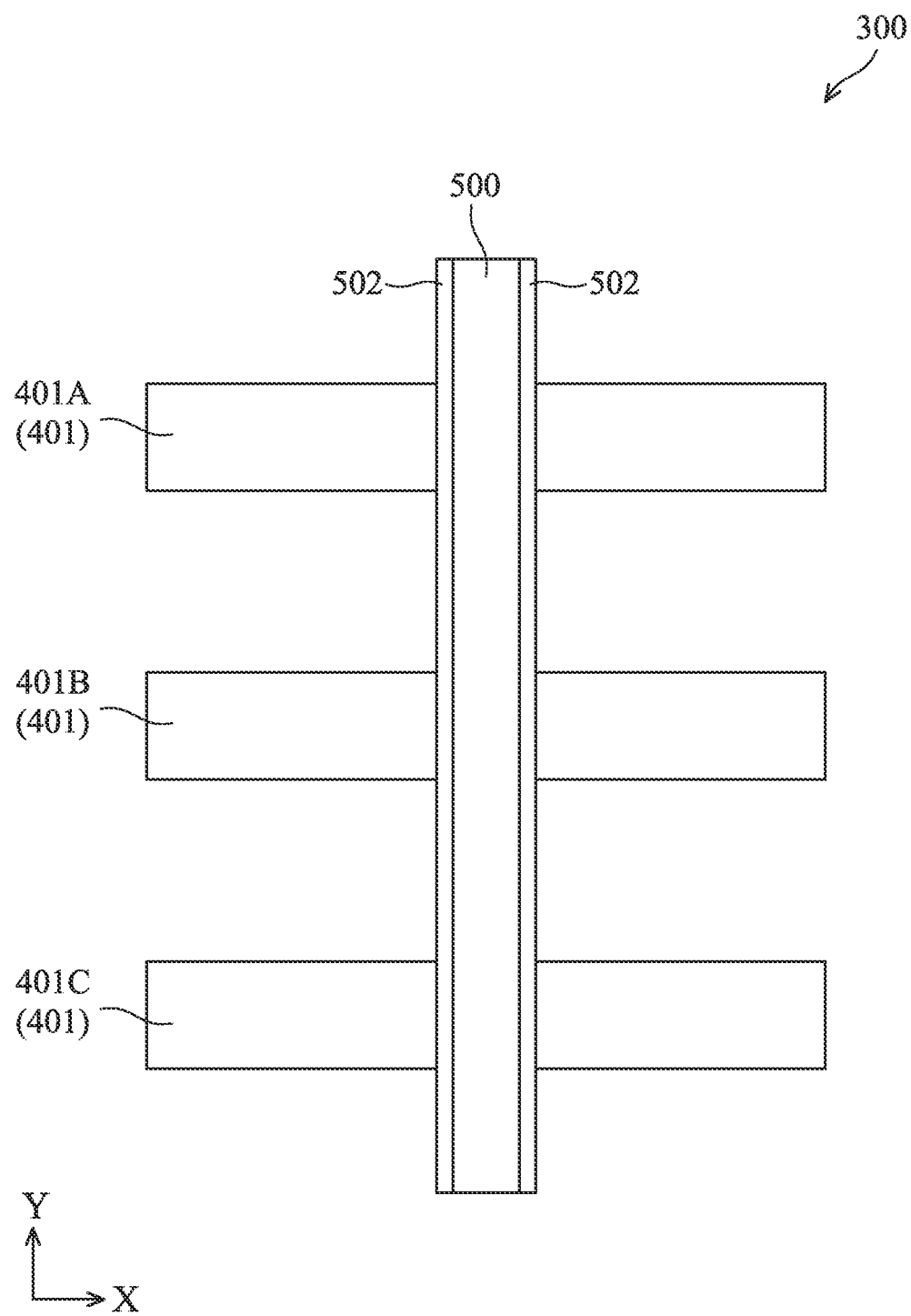

The dummy gate structure 500 may have a lengthwise direction perpendicular to the lengthwise direction of the fin structure 401, as better seen in FIG. 5B. As such, the dummy gate structure 500 may be formed to overlay (e.g., straddle) a portion of the fin structure 401. For example, the dummy gate structure 500 may straddle a central portion of the fin structure 401, such that end or side portions of the fin structure 401 are exposed, as shown in FIGS. 5A-B.

In some embodiments, the dummy gate structure 500 may contact the top surface of an isolation structure (not shown) embedding a lower portion of the fin structure 401, with its bottom surface. Such an isolation structure, typically referred to as a shallow trench isolation (STI), includes a number of portions, each of which is disposed between neighboring fin structures. In some other embodiments, the neighboring fin structures may be further separated by a cladding layer formed over the STI, which will be removed in a later fabrication stage. In such embodiments, the bottom surface of the dummy gate structure 500 may not contact the top surface of the STI.

The dummy gate structure 500 may include a dummy gate dielectric and a dummy gate, which are not shown separately for purpose of clarity. To form the dummy gate structure 500, a dielectric layer may be formed over the fin structure 401. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structure 500.

Upon forming the dummy gate structure 500, a gate spacer 502 may be formed on opposing sidewalls of the dummy gate structure 500, as shown in FIGS. 5A-B. The gate spacer 502 may each be a low-k spacer and may be formed of a suitable dielectric material, such as silicon oxide, silicon nitride, silicon carbide, silicon carbonitride, silicon oxynitride, silicon oxycarbonitride, or the like. Any suitable deposition method, such as thermal oxidation, chemical vapor deposition (CVD), or the like, may be used to form the gate spacer 502. The shapes and formation methods of the gate spacer 502, as illustrated in FIGS. 5A-B, are merely non-limiting examples, and other shapes and formation methods are possible. These and other variations are fully intended to be included within the scope of the present disclosure.

Figure 6:
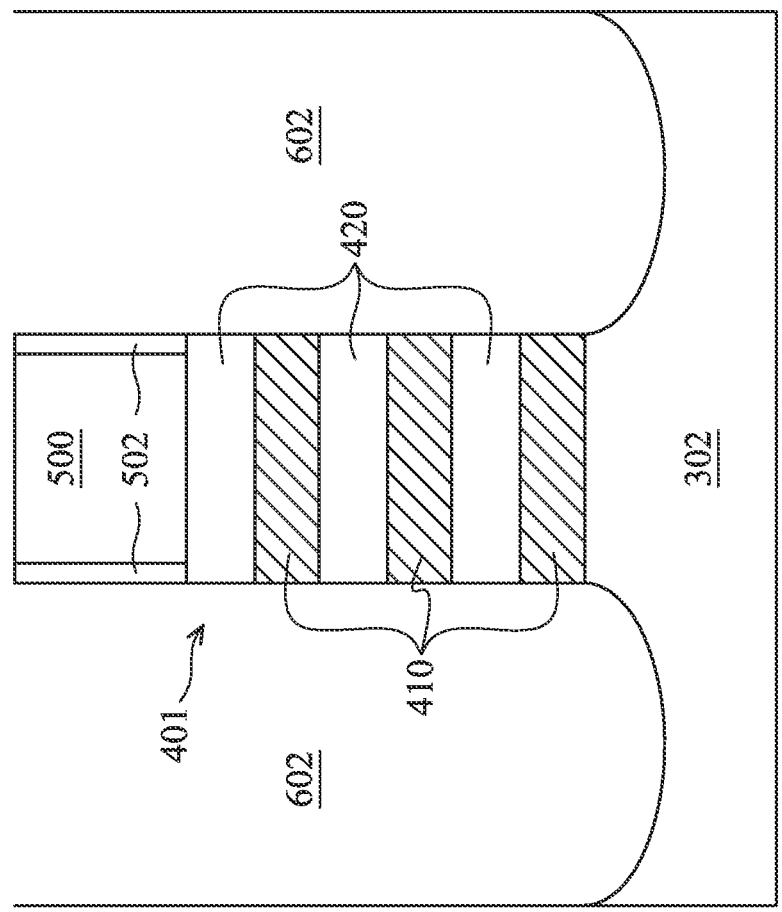

Corresponding to operation 208 of FIG. 2, FIG. 6 is a cross-sectional view of the GAA FET device 300 in which (e.g., end) portions of the fin structure 401 that are not overlaid by the dummy gate structure 500 (together with the gate spacer 502) are recessed, at one of the various stages of fabrication. The cross-sectional view of FIG. 6 is cut in a direction along the lengthwise direction of a number of channel layers of the GAA FET device 300 (e.g., cross-section A-A indicated in FIG. 1).

As shown, the dummy gate structure 500 (together with the gate spacer 502) can serve as a mask to recess (e.g., etch) the non-overlaid portions of the fin structure 401, which results in the remaining fin structure 401 having respective remaining portions of the semiconductor layers 410 and 420 alternately stacked on top of one another. As a result, recesses 602 can be formed on opposite sides of the remaining fin structure 410. A source/drain structure can be formed in each of the recesses 602 in a later fabrication stage. Accordingly, the recess 602 is sometimes referred to as a source/drain (S/D) recess. The recesses 602 can expose respective sidewalls of the remaining semiconductor layers 410 and 420. In some embodiments, such newly exposed sidewalls of the semiconductor layers 410 and 420 may vertically align with a sidewall of the gate spacer 502. Alternatively stated, a single contact face, consisting of the sidewalls of the semiconductor layers 410 and 410, can be formed on each side of the dummy gate structure 500.

The recessing step to form the recesses 602 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof.

Figure 7A:
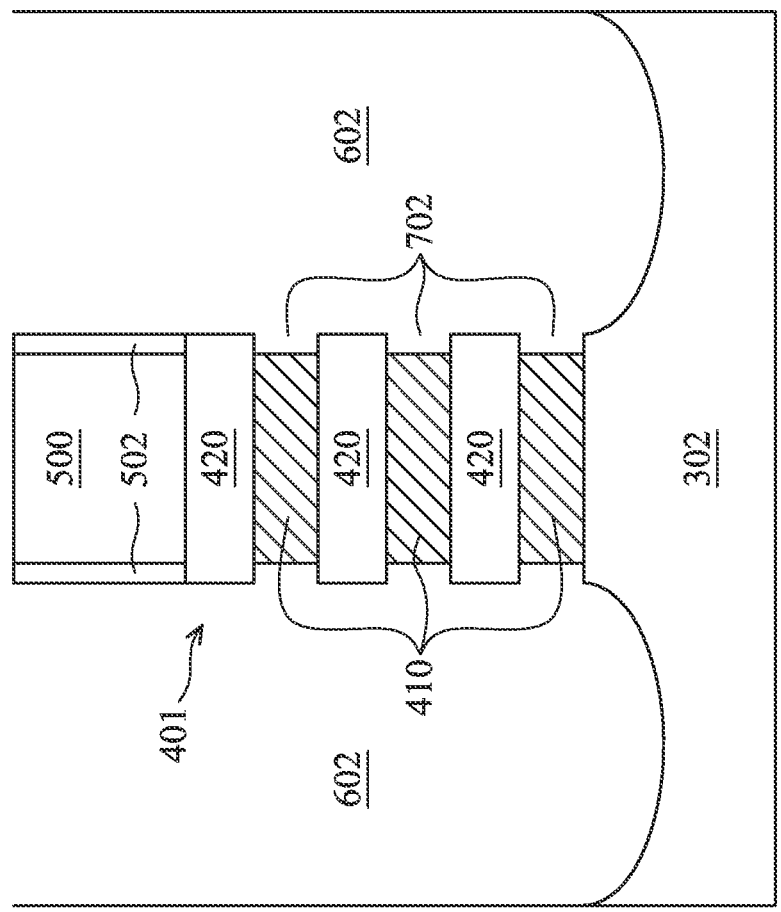
Figure 7B:
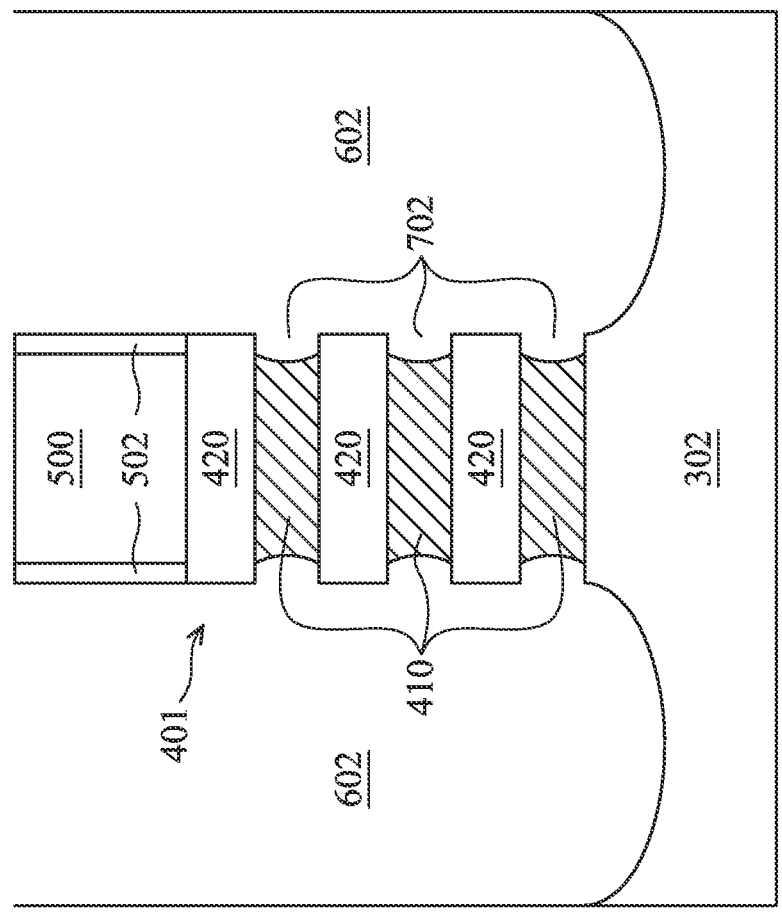

Corresponding to operation 210 of FIG. 2, FIG. 7A is a cross-sectional view of the GAA FET device 300 in which respective end portions of the semiconductor layers 410 are recessed, at one of the various stages of fabrication. In FIG. 7B, illustrated is a cross-sectional view of another embodiment of the GAA FET device 300. The cross-sectional views of FIGS. 7A and 7B are each cut in a direction along the lengthwise direction of a number of channel layers of the GAA FET device 300 (e.g., cross-section A-A indicated in FIG. 1).

The end portions of the semiconductor layers 410 can be removed (e.g., etched) using a "pull-back" process to pull the semiconductor layers 410 back by a pull-back distance. In an example where the semiconductor layers 420 include Si, and the semiconductor layers 410 include SiGe, the pull-back process may include a hydrogen chloride (HCl) gas isotropic etch process, which etches SiGe without attacking Si. As such, the Si layers (nanostructures) 420 may remain substantially intact during this process. Consequently, a pair of recesses, 702, can be formed on the ends of each semiconductor layer 410, with respect to the neighboring semiconductor layers 420. Alternatively or additionally, while etching the semiconductor layers 410, portions of the semiconductor layers 420 may also be etched back by a pull-back distance, which is generally controlled to be close to zero by selecting an etchant that has a high etching selectivity between the materials of the semiconductor layers 410 and 420.

Referring to FIGS. 7A and 7B, the gate spacer 502 may remain substantially intact during the pull-back process of the semiconductor layers 410. In such embodiments, the etchant used in the pull-back process can have a high etching selectivity between the materials of the gate spacer 502 and the semiconductor layers 410. For example, the etchant (e.g., $Cl_2$, HBr, $CF_4$, $CHF_3$, $CH_2F_2$, or $CH_3F$) may etch the semiconductor layers 410 at a substantially higher rate than etch the gate spacer 502. As such, a top surface of the topmost semiconductor layer of the fin structure 401 (e.g., 420) may remain covered by the dummy gate structure 500 and the gate spacer 502.

In the embodiment of FIG. 7A, the recess 702 can be formed with a straight-line-based sidewall. Accordingly, each recess 702 can form a pair of right angles, one of which is between the sidewall of a corresponding semiconductor layer 410 and the bottom surface of an upper neighboring semiconductor layer 420, and the other of which is between the sidewall of the corresponding semiconductor layer 410 and the top surface of a lower neighboring semiconductor layer 420. In the embodiments of FIG. 7B, the recess 702 can be formed with a curvature-based sidewall. The curvature-based sidewall may inwardly protrude toward the corresponding semiconductor layer 410. Such a curvature-based sidewall may be achieved by increasing an isotropic etching characteristic of the pull-back process, such that the semiconductor layers 410 may be etched non-uniformly along its sidewall.

Figure 8:
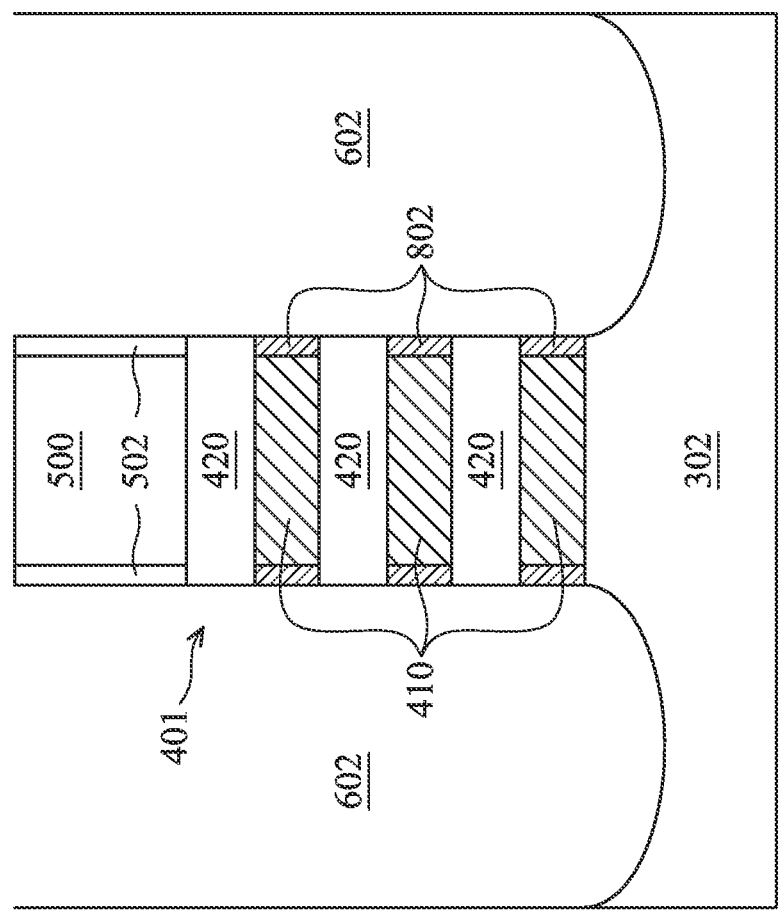

Corresponding to operation 212 of FIG. 2, FIG. 8 is a cross-sectional view of the GAA FET device 300 including a number of inner spacers 802, at one of the various stages of fabrication. The cross-sectional view of FIG. 8 is cut in a direction along the lengthwise direction of a number of channel layers of the GAA FET device 300 (e.g., cross-section A-A indicated in FIG. 1). The inner spacers 802 shown in FIG. 8 are formed based on the recesses 702 shown in FIG. 7A, and thus, it should be appreciated that the inner spacers 802 can have different profiles than FIG. 8 (e.g., based on the recesses 702 of FIG. 7B), while remaining within the scope of the present disclosure.

The inner spacers 802 can be formed conformally by chemical vapor deposition (CVD), or by monolayer doping (MLD) of nitride followed by spacer RIE. The inner spacers 802 can be deposited using, e.g., a conformal deposition process and subsequent isotropic or anisotropic etch back to remove excess spacer material on the sidewalls of the fin structures 401 and on a surface of the semiconductor substrate 302 (as shown in FIG. 8). A material of the inner spacers 802 can be formed from the same or different material as the gate spacer 502 (e.g., silicon nitride). For example, the inner spacers 802 can be formed of silicon nitride (SiN), silicoboron carbonitride (SiBCN), silicon carbonitride (SiCN), silicon carbon oxynitride (SiON), silicon oxycarbonitride (SiOCN), or any other type of dielectric material (e.g., a dielectric material having a dielectric constant less than about 5) appropriate to the role of forming an insulating gate sidewall spacers of transistors.

Figure 9A:
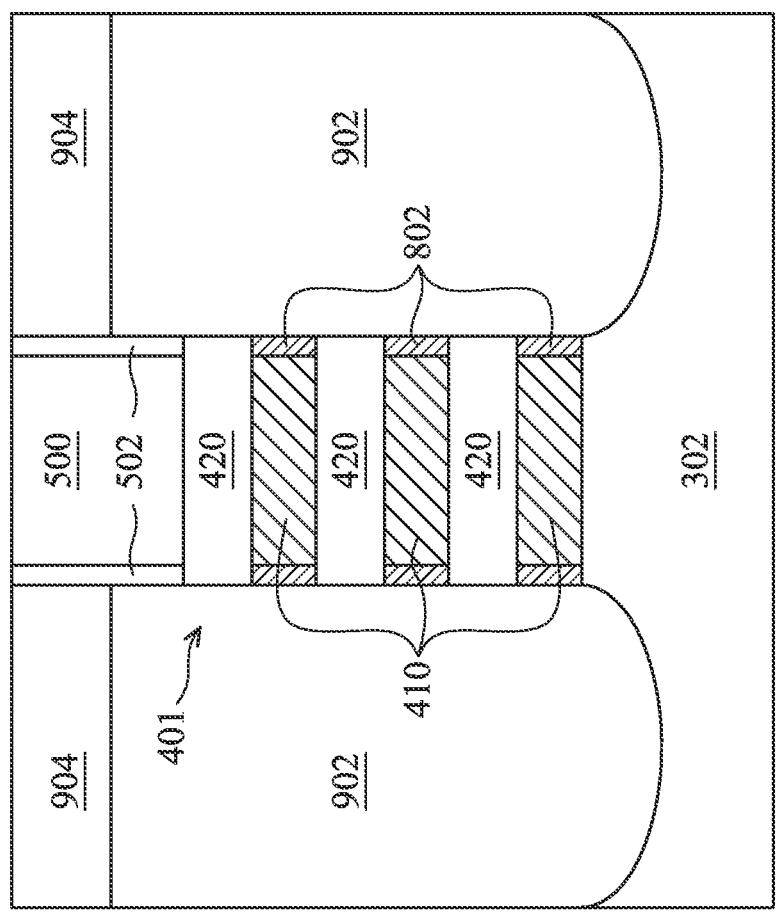
Figure 9B:
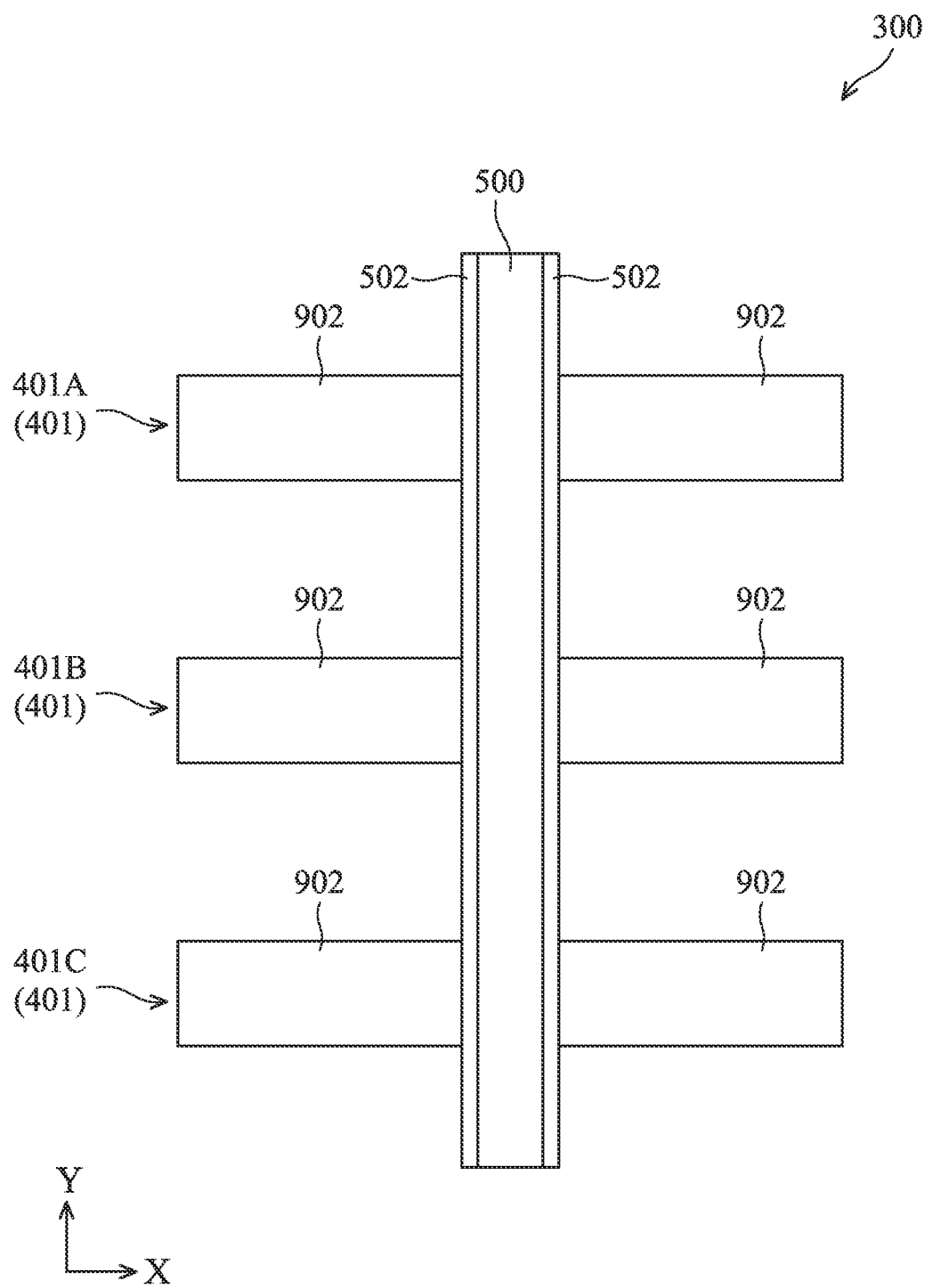

Corresponding to operation 214 of FIG. 2, FIG. 9A is a cross-sectional view of the GAA FET device 300 including source/drain structures 902 formed over the workpiece shown in FIG. 8, at one of the various stages of fabrication. The cross-sectional view of FIG. 9A is cut in a direction along the lengthwise direction of a number of channel layers of the GAA FET device 300 (e.g., cross-section A-A indicated in FIG. 1). Further, FIG. 9B illustrates a top view of the GAA FET device 300 at the stage of fabrication that corresponds to operation 214, in which the source/drain structures 902 are just formed.

The source/drain structure 902 is disposed in a corresponding one of the S/D recesses 602. As shown in FIGS. 9A-B, the source/drain structures 902 are disposed on the opposite sides of each of the fin structures 401A to 401C. The source/drain structures 902 are coupled to the semiconductor (channel) layers 420, and separated from the semiconductor (sacrificial) layers 410 with the inner spacer 802 disposed therebetween. The source/drain structures 902 are formed by epitaxially growing a semiconductor material in the recesses 602 using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Upon forming the source/drain structures 902, an interlayer dielectric (ILD) 904 is formed over the source/drain structure 902. The ILD 904 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structure 500, in some embodiments.

Figure 10A:
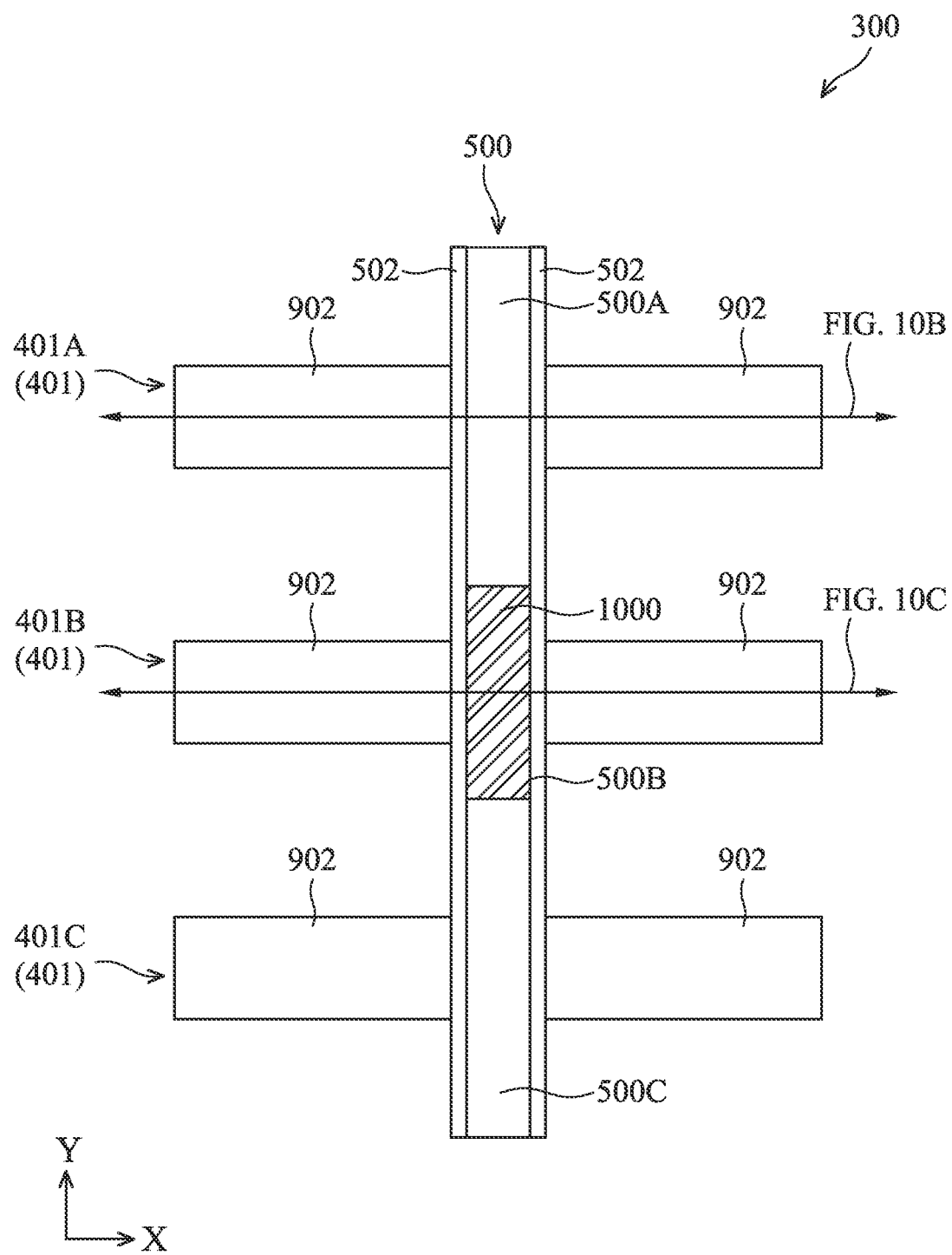

Corresponding to operation 216 of FIG. 2, FIG. 10A is a top view of the GAA FET device 300 in which one of the fin structures 401A to 401C is removed, at one of the various stages of fabrication. Further, FIGS. 10B and 10C each illustrate a cross-sectional view of the GAA FET device 300 at the stage of fabrication that corresponds to operation 216. The cross-sectional view of FIG. 10B is cut in a direction along the lengthwise direction of one of the channel structures that remains, e.g., 401A; and the cross-sectional view of FIG. 10C is cut in a direction along the lengthwise direction of one of the channel structures that has been partially removed, e.g., 401B.

Subsequently to forming the ILD 904 (not shown in FIG. 10A), a portion of the dummy gate structure 500 and a majority portion of one of the channel structures 401A to 401C overlaid by the portion of the dummy gate structure 500 is removed to form a cavity. The cavity can (e.g., vertically) extend into the substrate 302. Such a cavity can be filled with a dielectric material to form the isolation structure 1000. In some embodiments, the dielectric material may be a Si-based material such as, for example, SiO, SiCN, SiN, SiON, or combinations thereof. In some other embodiments, the dielectric material may be a metal-based material such as, for example, $Al_2O_3$. The isolation structure 1000 can thus separate remaining portions of the dummy gate structure 500 from each other.

For example in FIG. 10A, the dummy gate structure 500 can be grouped into three portions, 500A, 500B, and 500C, which overlay the channel structures 401A, 401B, and 401C, respectively. Upon forming the ILD 904, the portion 500B may be first removed, which exposes the channel structure 401B. Next, a majority portion of the channel structure 401B, which includes its remaining sacrificial layers 410 and a central portion of each of the channel layers 420, is removed until a cavity 1001 extends into the substrate 302 with a certain depth (FIG. 10C). Next, the cavity 1001 is filled with a dielectric material thereby forming the isolation structure 1000. As a result, the isolation structure 1000 is interposed between the source/drain structures 902 that were coupled to the removed channel structure 401B, as shown in FIGS. 10A and 10C, while the remaining channel structure 401A (and 401C) is still overlaid by the corresponding portion of the dummy gate structure 500A and coupled to its source/drain structures 902, as shown in FIGS. 10A and 10B. Specifically in FIG. 10C, the central portions of the channel layers 420 (together with the remaining sacrificial layers 410 and the portion of the dummy gate structure 500B) are replaced with the isolation structure 1000, while end portions of the channel layers 420 remain.

In various embodiments of the present disclosure, the removal of the portion of the dummy gate structure 500B and the majority portion of the channel structure 401B may be concurrently or respectively performed. For example, when the dummy gate structure 500 is formed of similar material(s) to the semiconductor (channel and sacrificial) layers of the channel structure 401B, e.g., Si, SiGe, etc., the portion of the dummy gate structure 500B and the majority portion of the channel structure 401B can be concurrently removed through one or more (e.g., plasma) etching processes. In such a plasma etching process (including radical plasma etching, remote plasma etching, and other suitable plasma etching processes), gas sources such as chlorine ($Cl_2$), carbon tetrafluoride ($CF_4$), fluoroform ($CHF_3$), difluoromethane ($CH_2F_2$), fluoromethane ($CH_3F$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. The gas sources and/or the passivation gases can be diluted with gases such as argon (Ar), helium (He), neon (Ne), and other suitable dilutive gases and combinations thereof.

Further, concurrently with removing the portion of the dummy gate structure 500B and the majority portion of the channel structure 401B, the etching process can be tuned to have less selectivity to the dielectric material that the inner spacers 802 contain. For example, a flow rate of one or more of the etchant gases, which has a less etching selectivity with respect to the dielectric material of the inner spacers 802 (SiN/SiCN/SiOCN/SiON), such as $Cl_2$, $CF_4$, $CHF_3$, $CH_2F_2$, and $CH_3F$ may be increased. Stated another way, the inner spacers 802 may also be etched when removing the portion of the dummy gate structure 500B and the majority portion of the channel structure 401B. As such, sidewalls of each of the inner spacers 802, exposed in the cavity 1001, can be shaped or otherwise patterned. This allows the inwardly protruding sidewall of an inner spacer 802 (with respect to its corresponding sacrificial layer 410) to be removed, thereby causing the inner spacer 802 to have a nearly vertical sidewall facing the cavity 1001. With this nearly vertical profile, the etchant gas used to form the cavity may not be blocked, which allows the etchant gas to reach a lower portion of the to-be-removed channel structure 401B. Consequently, the isolation structure 1000, inheriting the profile of the cavity 1001, can be successfully formed to separate the dummy gate portions 500A and 500C, which will later be replaced with metal gate structures, respectively.

FIGS. 11A-11L illustrate various profiles of the inner spacer 802 with one of its sidewalls contacting the isolation structure 1000, in accordance with various embodiments. For example, profiles on the left-hand side (boxed with dotted lines) are a first sidewall of the inner spacer 802 contacting the source/drain structure 902, and profiles on the right-hand side are a second sidewall of the inner spacer 802 contacting the isolation structure 1000. Accordingly, a first interface is present between the first sidewall of the inner spacer 802 and the source/drain structure 902, and a second interface is present between the second sidewall of the inner spacer 802 and the isolation structure 1000.

In some embodiments, as shown in FIGS. 11A-C and 11G-I, the inner spacer 802 may be formed of a single film. In some embodiments, as shown in FIGS. 11D-F and 11J-L, the inner spacer 802 may be formed of multiple films. Further, in some embodiments, as shown in FIGS. 11G-L, the inner spacer 802 may include a void or seam 1102. In some embodiments, as shown in FIGS. 11A, 11D, 11G, and 11J, profiles of the first sidewall of the inner spacer 802 facing the source/drain structure 902 may be substantially straight, while, as shown in FIGS. 11B, 11C, 11E, 11F, 11H, 11I, 11K and 11L, profiles of the first sidewall of the inner spacer 802 may have a shape concave toward the inner spacer itself. In some embodiments, as shown in FIGS. 11A, 11B, 11D, 11E, 11G, 11H, 11J, and 11K, profiles of the second sidewall of the inner spacer 802 facing the isolation structure 1000 may have a shape concave toward the isolation structure 1000. In some embodiments, as shown in FIGS. 11C, 11F, 11I, and 11L, profiles of the second sidewall of the inner spacer 802 facing the isolation structure 1000 may be substantially straight.

In various embodiments, one or more profiles of the inner spacer 802 contacting the isolation structure 1000 (used to contact the removed fin structure 401B) can be characterized with a number of critical dimensions. Similarly, one or more profiles of the inner spacer 802 contacting the remaining channel structure (e.g., 401A and 401C) can also be characterized with a number of critical dimensions. For illustration purposes, the inner spacer 802 contacting the isolation structure 1000 and the inner spacer 802 contacting the remaining channel structure are herein referred to as "inner spacer 802I" and "inner spacer 802C," respectively. According the various embodiments, the inner spacer 802I has a first interface present between one of its sidewalls and a corresponding source/drain structure, and a second interface present between the other of its sidewalls and a corresponding isolation structure; and the inner spacer 802C has a first interface present between one of its sidewalls and a corresponding source/drain structure, and a second interface present between the other of its sidewalls and a corresponding channel structure (e.g., a channel layer).

For example in FIG. 12A, a profile of the inner spacer 802C is shown, in comparison with different profiles of the inner spacer 802I shown in FIGS. 12B and 12C, respectively. Further, the profiles shown in FIGS. 12B and 12C refer to different amounts of the inner spacer 802I being etched (in operation 212 of FIG. 2), in some embodiments. Similarly, FIG. 12D illustrates a profile of the inner spacer 802C, in comparison with different profiles of the inner spacer 802I shown in FIGS. 12E and 12F that refer to different amounts of the inner spacer 802I being etched, respectively; and FIG. 12G illustrates a profile of the inner spacer 802C, in comparison with different profiles of the inner spacer 802I shown in FIGS. 12H and 12I that refer to different amounts of the inner spacer 802I being etched, respectively.

As illustrated in FIG. 12A (which serves as a representative example for the inner spacer 802C), the inner spacer 802C is characterized by critical dimensions, $CD_{x'}$, $CD_{y'}$, and $\theta_O$; and as illustrated in FIG. 12B (which serves as a representative example for the inner spacer 802I), the inner spacer 802I is characterized by critical dimensions, $CD_x$, $CD_y$, and $\theta_C$.

Specifically in FIG. 12A, $CD_{x'}$ represents a closest distance laterally measured from the tip of a seam within the inner spacer 802C to a sidewall of the inner spacer 802C facing a corresponding channel structure; $CD_{y'}$ represents a distance vertically measured from the seam to a top or bottom surface of the inner spacer 802C; and $\theta_O$ represents an angle between the sidewall of the inner spacer 802C and the top or bottom surface of the inner spacer 802C.

Figure 12J:
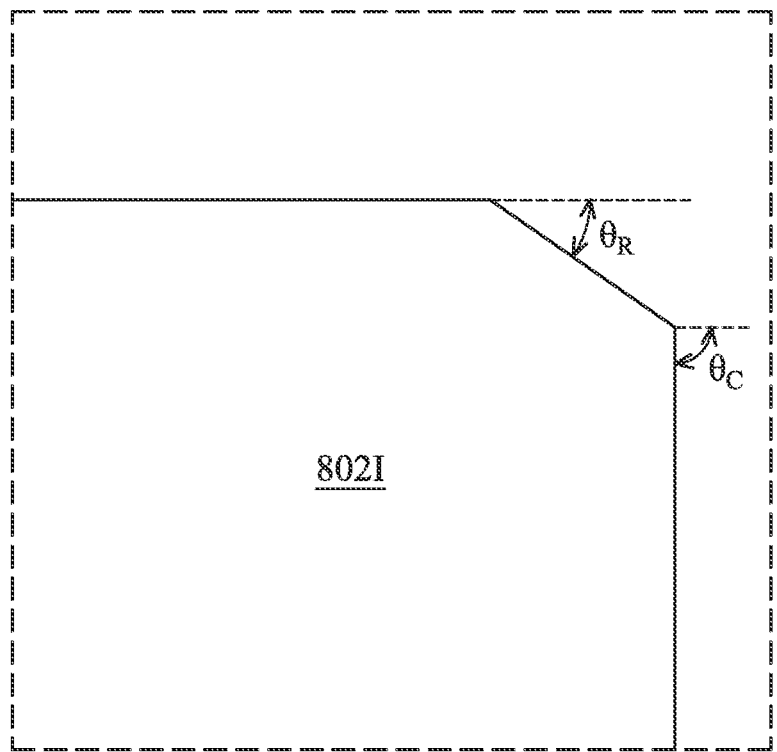

Specifically in FIGS. 12B and 12C, $CD_x$ represents a closest distance laterally measured from the tip of a seam within the inner spacer 802I to a sidewall of the inner spacer 802I facing a corresponding isolation structure; $CD_y$ represents a distance vertically measured from the seam to a top or bottom surface of the inner spacer 802I; and $\theta_C$ represents an angle between the sidewall of the inner spacer 802I and the top or bottom surface (or its projection) of the inner spacer 802I. Further, for the inner spacer 802I (e.g., FIG. 12B), an enlarged profile of a connecting portion 1201 disposed between the nearly vertical sidewall and the top/bottom surface is shown in FIG. 12J. With this connecting portion present, the inner spacer 802I can be further characterized by a critical dimension $\theta_R$ that represents an angle between the top/bottom surface and the connecting portion of the inner spacer 802I.

In accordance with various embodiments of the present disclosure, one of the sidewalls of the inner spacer 802I is exposed and patterned during operation 216, while the inner spacer 802C may remain substantially intact during operation 216 with both of the sidewalls kept covered. Accordingly, $CD_{x'}$ can be substantially greater than $CD_x$, and $CD_x$ can become substantially smaller as a patterned (e.g., etched) amount of the sidewall increases, as illustrated in the examples of FIGS. 12A-C, 12D-F, and 12G-I, respectively.

In the example of FIGS. 12A-C, the inner spacer 802C and inner spacer 802I (before being patterned) may both present a profile having one sidewall (facing a corresponding source/drain structure) with a straight profile and the other sidewall (facing a corresponding channel structure) with a protruding profile, e.g., similar to FIG. 11G. Following the patterning step (operation 216), the protruding sidewall of the inner spacer 802C may remain, while the protruding sidewall of the inner spacer 802I may be patterned to have a straight profile along its majority portion.

In the example of FIGS. 12D-F, the inner spacer 802C and inner spacer 802I (before being patterned) may both present a profile having one sidewall (facing a corresponding source/drain structure) with a concave profile and the other sidewall (facing a corresponding channel structure) with a protruding profile, e.g., similar to FIG. 11H. Following the patterning step (operation 216), the protruding sidewall of the inner spacer 802C may remain, while the protruding sidewall of the inner spacer 802I may be patterned to have a straight profile along its majority portion.

In the example of FIGS. 12G-I, the inner spacer 802C and inner spacer 802I (before being patterned) may both present a profile having one sidewall (facing a corresponding source/drain structure) with a concave profile and the other sidewall (facing a corresponding channel structure) with a straight profile, e.g., similar to FIG. 11I. Following the patterning step (operation 216), the straight sidewall of the inner spacer 802C may remain, while the straight sidewall of the inner spacer 802I may be patterned to retreat toward its concave sidewall.

In some embodiments where the examples of FIGS. 12A-C, FIGS. 12D-F, and FIGS. 12G-I are respectively applied, since the inner spacer 802C generally have a sidewall (facing the channel structure) that laterally extends with a more distance than 802I, $CD_{x'}-CD_x$ may be equal to or greater than about 0.3 nanometers (nm), where $CD_{x'}$ is in a range from about 2 nm to about 30 nm, and $CD_x$ is in a range from about 0 nm to about 29.7 nm. It should be noted that the scenario where $CD_x=0$ (FIGS. 12C, 12F, and 12I) may occur when the seam tip reaches the sidewall of the inner spacer 802I, in some embodiments. In some embodiments, $CD_{y'}$ may be substantially close to $CD_y$ (i.e., with a ratio ranging from about 0.9 to about 1.1), where $CD_{y'}$ is in a range from about 2 nm to about 30 nm, and $CD_y$ is in a range from about 2 nm to about 30 nm.

Further, in the examples where the protruding sidewall of the inner spacer 802C remains (FIGS. 12A and 12D), $\theta_O$ may be in a range of about 30° to about 87°. In comparison, with a majority portion of the protruding sidewall of the inner spacer 802I being etched, $\theta_C$ may be in a range of about 75° to about 135°. When $\theta_C$ is equal to 90°, it refers to the scenario where the "patterned" sidewall of the inner spacer 802I has a nearly vertical profile. According to various embodiments of the present disclosure, $\theta_C$ should not be less than 90° with more than 15°, and should be equal to or greater than 90°. With its majority portion being patterned as a straight profile, the sidewall of the inner spacer 802I can have a connecting portion between the nearly straight sidewall and its top/bottom surface, as illustrated in the enlarged view of FIG. 12J. As shown, $\theta_R$ may be an acute angle, which is in a range of about 30° to about 87°. In the example where the sidewall of the inner spacer 802C is formed as a straight profile (FIG. 12C), $\theta_O$ may be close to about 90°. Similarly, with the already nearly vertical sidewall of the inner spacer 802I being retreated, $\theta_C$ may still be close to about 90°.

FIGS. 13A-E illustrate various profiles of the multi-layer inner spacer 802 (including the inner spacer 802C and inner spacer 802I) after operation 216, in accordance with various embodiments. In the examples of FIGS. 13A-E, each of the inner spacer 802C and inner spacer 802I is formed to have a first layer and a second layer (i.e., before performing operation 216), where both the inner spacer 802C and inner spacer 802I may have their sidewalls (facing a corresponding channel structure) presenting a protruding profile, and their other sidewalls (facing a corresponding source/drain structure) presenting a nearly vertical profile. It should be appreciated that such a multi-layer inner spacer 802 can also have their sidewalls presenting different profiles than FIGS. 13A-E (e.g., FIGS. 11K, 11L, etc.), while remaining within the scope of the present disclosure.

In some embodiments, the first layer may be first deposited, followed by deposition of the second layer. As such, the first layer can line the inner spacer recess (e.g., 702), with the rest of the inner spacer recess filled with the second layer. Upon operation 216 being performed, a majority portion of the protruding sidewall of the inner spacer 802I, which may be formed by the first layer or even the second layer, may be patterned to have a nearly vertical profile. The profile of each of the inner spacer 802C and inner spacer 802I can be characterized with a respective number of critical dimensions.

Figure 13A:
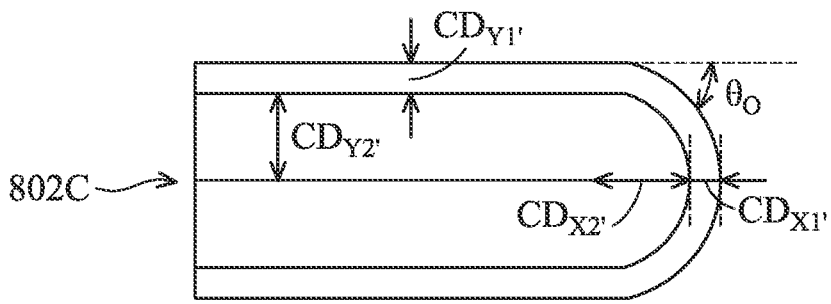
Figure 13B:
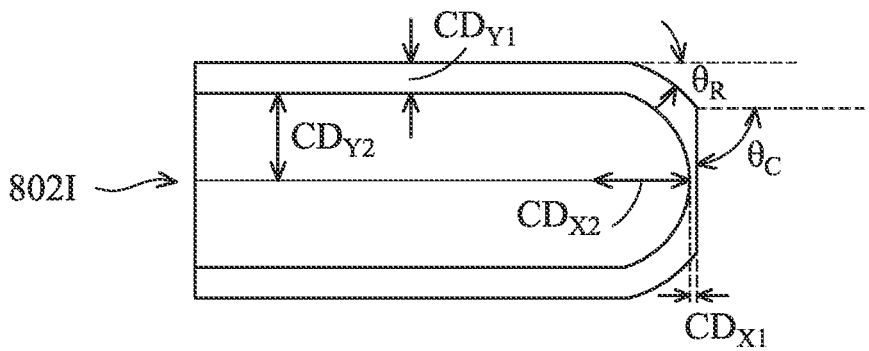

As illustrated in FIG. 13A (which serves as a representative example for the inner spacer 802C), the inner spacer 802C is characterized by critical dimensions, $CD_{x1'}$, $CD_{x2'}$, $CD_{y1'}$, $CD_{y2'}$, and $\theta_O$; and as illustrated in FIG. 13B (which serves as a representative example for the inner spacer 802I), the inner spacer 802I is characterized by critical dimensions, $CD_{x1}$, $CD_{x2}$, $CD_{y1}$, $CD_{y2}$, $\theta_O$, and $\theta_R$.

Specifically in FIG. 13A, $CD_{x1'}$ represents a distance laterally measured from a tip of the second layer of the inner spacer 802C to a sidewall of the inner spacer 802C facing a corresponding channel structure (alternatively, a laterally measured thickness of the first layer of the inner spacer 802C); $CD_{x2'}$ represents a closest distance laterally measured from the tip of a seam within the inner spacer 802C to the tip of the second layer; $CD_{y1'}$ represents a distance vertically measured from a top or bottom surface of the second layer to a top or bottom surface of the inner spacer 802C (alternatively, a vertically measured thickness of the first layer of the inner spacer 802C); $CD_{y2'}$ represents a distance vertically measured from the seam to the top or bottom surface of the second layer; and $\theta_O$ represents an angle between the sidewall of the inner spacer 802C and the top or bottom surface of the inner spacer 802C.

Specifically in FIG. 13B, $CD_{x1}$ represents a distance laterally measured from a tip of the second layer of the inner spacer 802I to a sidewall of the inner spacer 802I facing a corresponding isolation structure (alternatively, a laterally measured thickness of the first layer of the inner spacer 802I); $CD_{x2}$ represents a closest distance laterally measured from the tip of a seam within the inner spacer 802I to the tip of the second layer; $CD_{y1}$ represents a distance vertically measured from a top or bottom surface of the second layer to a top or bottom surface of the inner spacer 802I (alternatively, a vertically measured thickness of the first layer of the inner spacer 802I); $CD_{y2}$ represents a distance vertically measured from the seam to the top or bottom surface of the second layer; and $\theta_C$ represents an angle between the sidewall of the inner spacer 802I and the top or bottom surface (or its projection) of the inner spacer 802I. Similarly, with a connecting portion between the sidewall and the top/bottom surface present, the inner spacer 802I can be further characterized by a critical dimension $\theta_R$ that represents an angle between the top/bottom surface and the connecting portion of the inner spacer 802I. It should be appreciated that $\theta_O$, $\theta_C$, and $\theta_R$ may follow the trend similar to the trend when the inner spacers 802I and 802C are each formed of a single layer, and thus, the associated description will not be repeated.

In accordance with various embodiments of the present disclosure, one of the sidewalls of the inner spacer 802I is exposed and patterned during operation 216, while the inner spacer 802C may remain substantially intact during operation 216 with both of the sidewalls kept covered. Accordingly, $CD_{x1'}$ can be substantially greater than $CD_{x1}$, and $CD_{x1}$ (even $CD_{x2}$) can become substantially smaller as a patterned (e.g., etched) amount of the sidewall increases, as illustrated in the example of FIGS. 13B-E.

Starting with the example shown in FIGS. 13A-B, the inner spacer 802C and inner spacer 802I (before being patterned) may both present a profile having one sidewall (facing a corresponding source/drain structure) with a straight profile and the other sidewall (facing a corresponding channel structure) with a protruding profile, e.g., similar to FIG. 11G. Following the patterning step (operation 216), the protruding sidewall of the inner spacer 802C may remain, while the protruding sidewall of the inner spacer 802I may be patterned to have a straight profile along its majority portion. As such, $CD_{x1'}-CD_{x1}$ may be equal to or greater than about 0.3 nanometers (nm). In some embodiments, $CD_{y1'}$ may be substantially close to $CD_{y1}$ and $CD_{y2'}$ may be substantially close to $CD_{y2}$ (i.e., with a ratio ranging from about 0.9 to about 1.1).

Figure 13C:
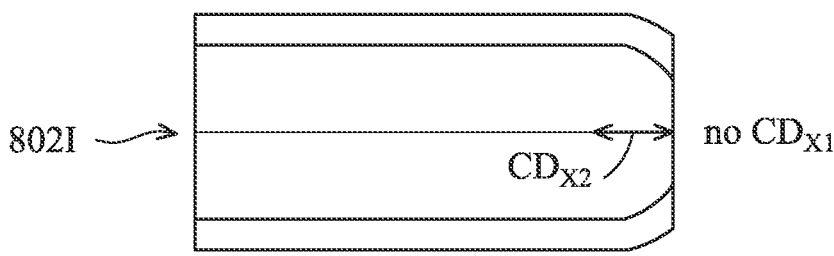
Figure 13D:
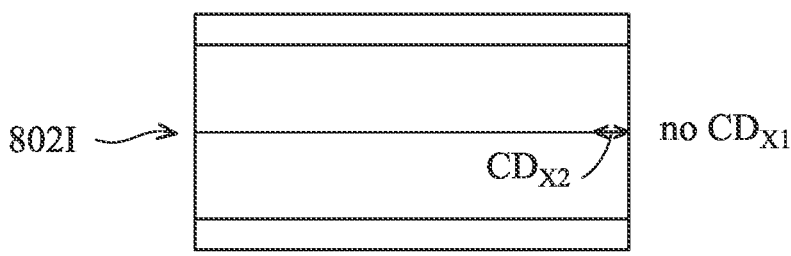
Figure 13E:
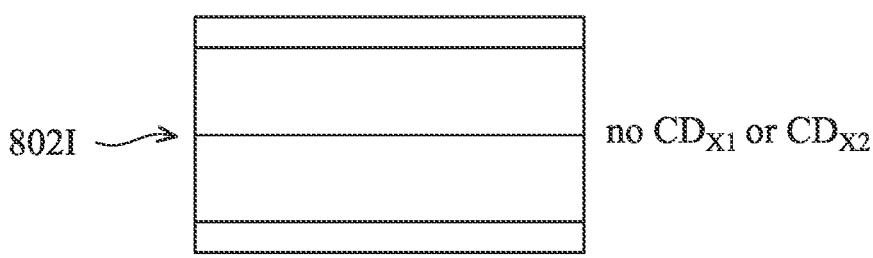

Continuing with the example shown in FIGS. 13B-E, with an increasing amount of the protruding sidewall being etched, $CD_{x1}$ reduces, and even $CD_{x2}$ also reduces, which may affect at least one of: a difference between $CD_{x1}$ and $CD_{y1}$, a difference between $CD_{x2}$ and $CD_{y2}$, a difference between $CD_{y1'}$ and $CD_{x1'}$, or a difference between $CD_{y2'}$ and $CD_{x2'}$. In FIG. 13B (where only the first layer is etched during operation 216), $CD_{x1'}-CD_{x1} \geq 0.3$ nm; $CD_{x2'} \approx CD_{x2}$; $CD_{y1} \approx CD_{x1}$; $CD_{y1}-CD_{x1} \geq 0.3$ nm; $CD_{y1}-CD_{x1} \geq CD_{y1'}-CD_{x1'}$, with a difference being equal to or greater than 0.3 nm; and $CD_{y2'} \approx CD_{x2}$. In FIGS. 13C-D (where both the first and second layers are etched during operation 216), $CD_{x1'}-CD_{x1} \geq 0.3$ nm; $CD_{x1}=0$; $CD_{x2}<CD_{x2'}$; $CD_{x2'}-CD_{x2} \geq 0.3$ nm; $CD_{y1}>CD_{x1}$; $CD_{y1}-CD_{x1} \geq 0.3$ nm; $CD_{y1}-CD_{x1} \geq CD_{y1'}-CD_{x1'}$, with a difference being equal to or greater than 0.3 nm; $CD_{x2}<CD_{y2}$; $CD_{y2}-CD_{x2} \geq 0.3$ nm; and $CD_{y2}-CD_{x2}>CD_{y2'}-CD_{x2'}$, with a difference being equal to or greater than 0.3 nm. In FIG. 13E (where both the first and second layers are etched and the sidewall of the inner spacer 802I reaches the tip of the seam during operation 216), $CD_{x1'}-CD_{x1} \geq 0.3$ nm; $CD_{x1}=0$; $CD_{x2}<CD_{x2'}$; $CD_{x2'}-CD_{x2} \geq 0.3$ nm; $CD_{x2}=0$; $CD_{y1}>CD_{x1}$; $CD_{y1}-CD_{x1} \geq 0.3$ nm; $CD_{y1}-CD_{x1} \geq CD_{y1'}-CD_{x1'}$, with a difference being equal to or greater than 0.3 nm; $CD_{x2}<CD_{y2}$; $CD_{y2}-CD_{x2} \geq 0.3$ nm; and $CD_{y2}-CD_{x2}>CD_{y2'}-CD_{x2'}$, with a difference being equal to or greater than 0.3 nm.

In brief summary, when the last deposited layer of the inner spacer 802I is not etched during operation 216 (e.g., FIG. 13B), $CD_{yn} \approx CD_{xn}$, where $CD_{yn}$ represents a vertical distance between a seam within the inner spacer 802I and a top/bottom surface of the last deposited layer, and $CD_{xn}$ represents a lateral distance between a tip of the seam and a tip of the last deposited layer of the inner spacer 802I. When a portion of the last deposited layer of the inner spacer 802I is etched during operation 216 (e.g., FIGS. 13C and 13D), $CD_{x1}=0$. When a portion of the last deposited layer of the inner spacer 802I is etched and the sidewall of the inner spacer 802I reaches the tip of the seam contained therein during operation 216 (e.g., FIG. 13E), $CD_{yn}-CD_{xn} \geq 0.3$ nm, and $CD_{yn}-CD_{xn}>CD_{yn'}-CD_{xn'}$, with a difference being equal to or greater than 0.3 nm, where $CD_{yn'}$ represents a vertical distance between a seam within the inner spacer 802C and a top/bottom surface of the last deposited layer, and $CD_{xn'}$ represents a lateral distance between a tip of the seam and a tip of the last deposited layer of the inner spacer 802C.

Figure 14A:
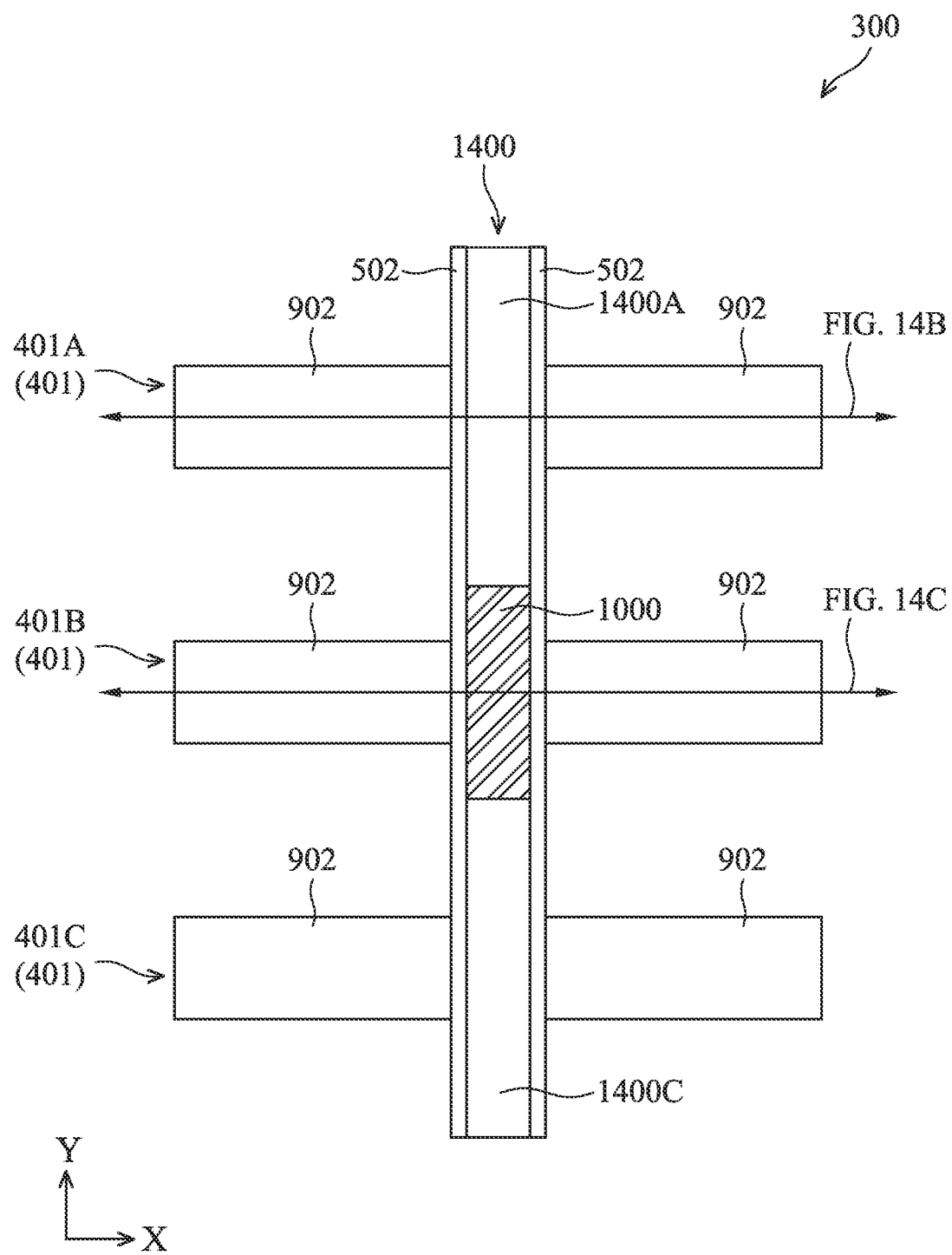

Corresponding to operation 218 of FIG. 2, FIG. 14A is a top view of the GAA FET device 300 including active (e.g., metal) gate structures 1400A and 1400C, at one of the various stages of fabrication. Further, FIGS. 14B and 14C each illustrate a cross-sectional view of the GAA FET device 300 at the stage of fabrication that corresponds to operation 218. The cross-sectional view of FIG. 14B is cut in a direction along the lengthwise direction of one of the channel structures that remains, e.g., 401A; and the cross-sectional view of FIG. 14C is cut in a direction along the lengthwise direction of one of the channel structures that has been partially removed, e.g., 401B.

The gate structures 1400A and 1400C may replace the dummy gate portion 500A (and remaining sacrificial layers of the channel structure 401A overlaid by the dummy gate portion 500A) and the dummy gate portion 500C (and remaining sacrificial layers of the channel structure 401C overlaid by the dummy gate portion 500C), respectively, in accordance with various embodiments. For example, upon forming the isolation structure 1000 and patterning the inner spacers 802I along the sidewalls of the isolation structure 1000, the dummy gate portion 500A is removed. Concurrently or subsequently, the remaining portion of each of the sacrificial layers of the channel structure 401A is removed, thereby forming a gate trench. Such a trench is filled with the active gate structure 1400A. The active gate structure 1400A can wrap around each of the channel layers 420 of the channel structure 401A, with a pair of the source/drain structures 902 disposed on opposite sides of the active gate structure 1400A and coupled to the channel layers 420. Following the similar processes, the active gate structure 1400C can wrap around each of the channel layers 420 of the channel structure 401C, with a pair of the source/drain structures 902 disposed on opposite sides of the active gate structure 1400C and coupled to the channel layers 420.

Upon forming the active gate structures, a number of transistors (e.g., GAA FETs) can be formed. For example, a first transistor can be defined by the active gate structure 1400A, the channel layers 420 of the channel structure 401A, and a pair of the source/drain structures 902 disposed on the sides of the active gate structure 1400A; and a second transistor can be defined by the active gate structure 1400C, the channel layers 420 of the channel structure 401C, and a pair of the source/drain structures 902 disposed on the sides of the active gate structure 1400C. With the isolation structure 1000 formed, the first and second transistors (specifically, the active gate structures 1400A and 1400C) can be electrically isolated from each other in a relatively small pitch.

The active gate structures 1400A and 1400C can each include a gate dielectric and a gate metal, in some embodiments. The gate dielectric can wrap around each of the corresponding channel layers 420, e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 420.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

Figure 15:
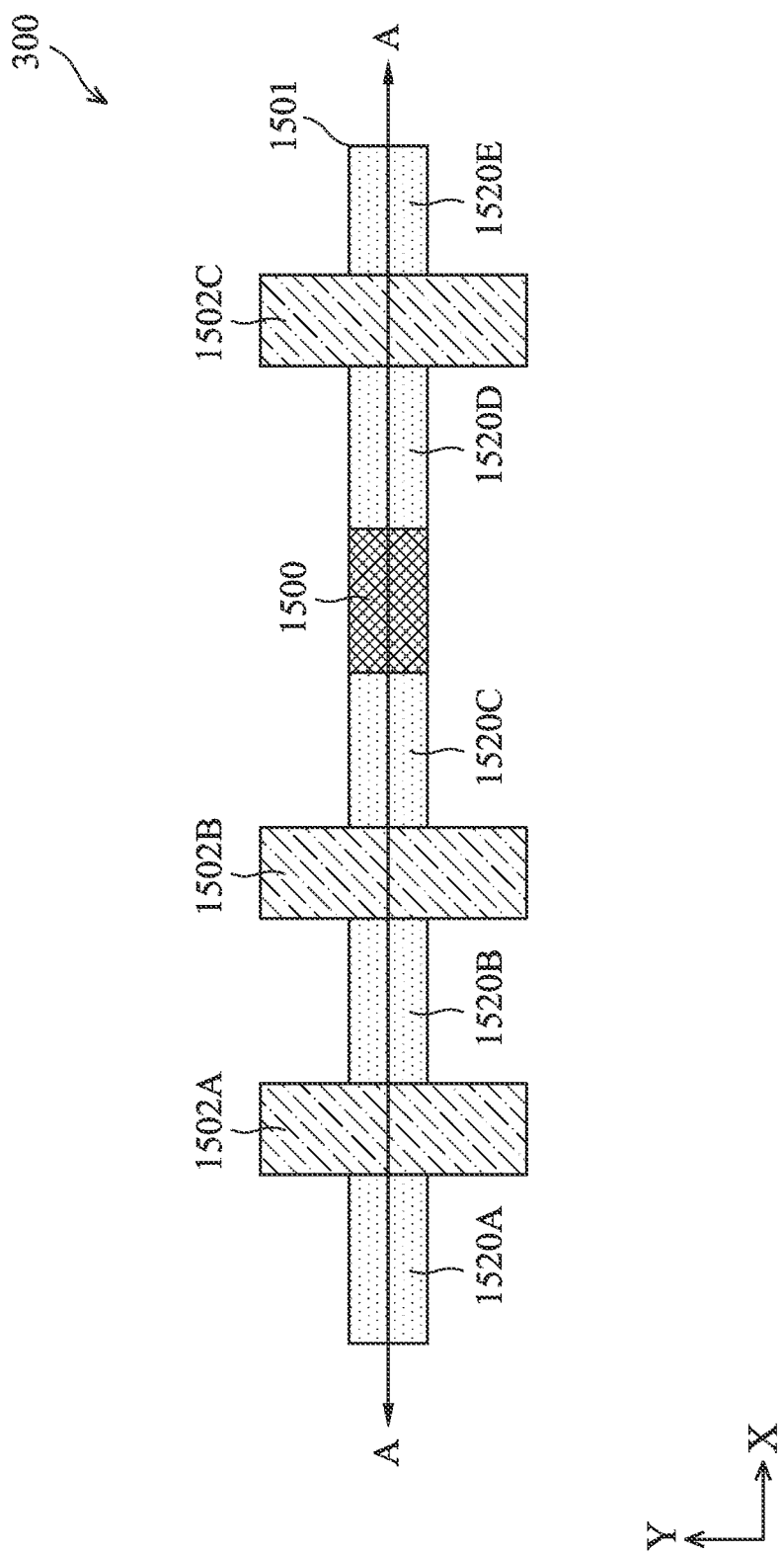
FIGS. 15 and 16 illustrates a top view and a cross-sectional view of another portion of the example GAA FET, respectively, made by the method of FIG. 2, in accordance with some embodiments.
Figure 16:
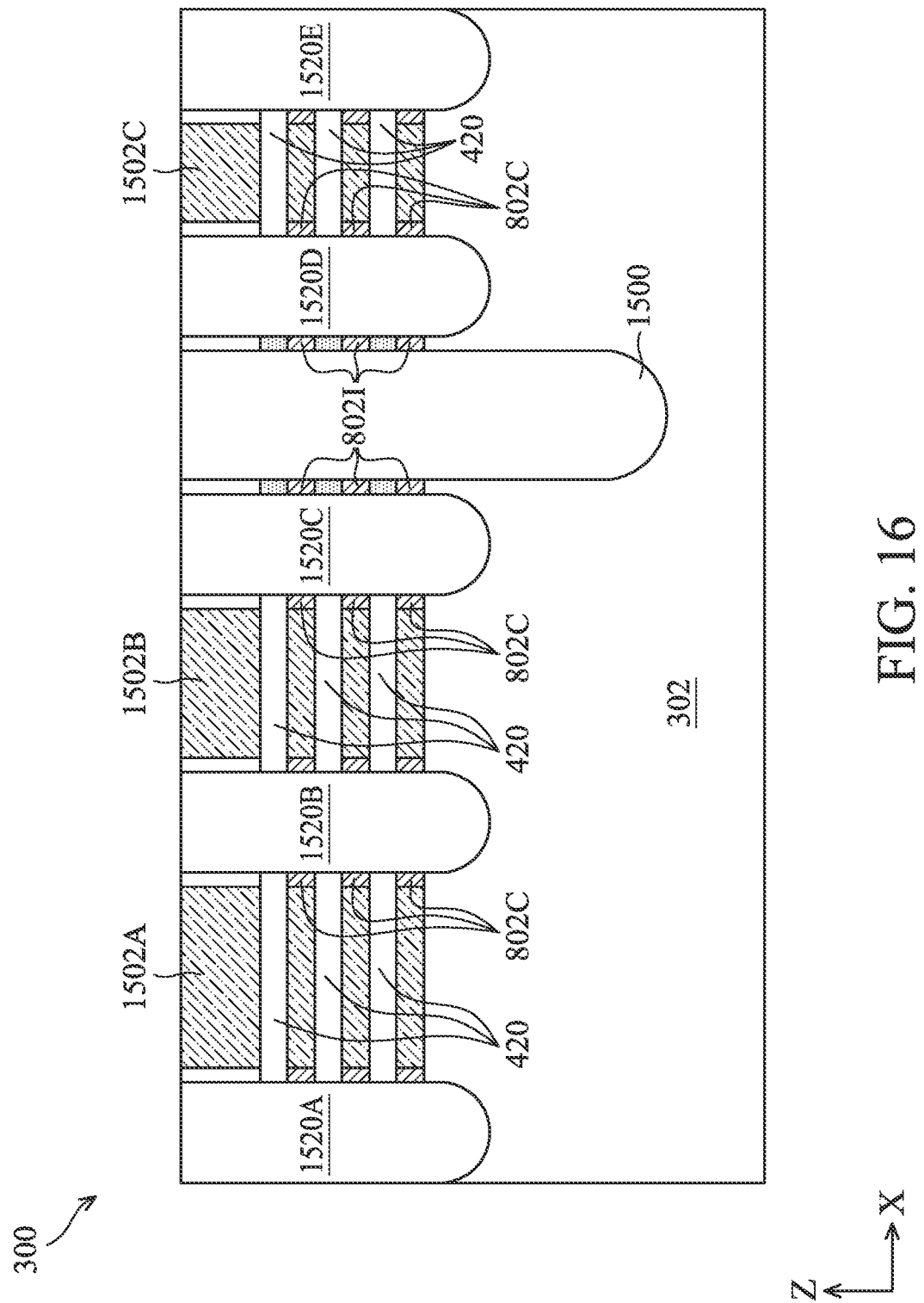

In some other embodiments, the above-discussed isolation structure 1000 can be formed along a channel structure to isolate different portions of the channel structure. FIG. 15 illustrates a top view of the semiconductor device 300 in which an isolation structure 1500 is formed along a channel structure 1501, in accordance with various embodiments. FIG. 16 further illustrates a corresponding cross-sectional view of the semiconductor device 300 cut along line A-A indicated in FIG. 15 (a lengthwise direction of the channel structure 1501) Referring to FIG. 15, the channel structure 1501 extends along the X-direction, with a number of active gate structures 1502A, 1502B, and 1502C straddling respective portions of the channel structure 1501. The non-straddled portions of the channel structure 1501 can form a number of source/drain structures 1520A, 1520B, 1520C, 1520D, and 1520E. The isolation structure 1500, channel structure 1501, active gate structures 1502A-C, and source/drain structures 1520A-E are substantially similar to the above-discussed isolation structure 1000, channel structure 401, active gate structures 1400A-C, and source/drain structures 902, respectively. Accordingly, each of the features shown in FIG. 15 will be briefly described as follows.

For example, a first transistor can be defined by the active gate structure 1502A, the portion of the channel structure 1501 overlaid by the active gate structure 1502A, and the source/drain structures 1520A and 1520B; a second transistor can be defined by the active gate structure 1502B, the portion of the channel structure 1501 overlaid by the active gate structure 1502B, and the source/drain structures 1520B and 1520C; and a third transistor can be defined by the active gate structure 1502C, the portion of the channel structure 1501 overlaid by the active gate structure 1502C, and the source/drain structures 1520D and 1520E. The isolation structure 1500 can electrically isolate the second and third transistors (specifically, the source/drain structures 1520C and 1520D).

As further illustrated in the cross-sectional view of FIG. 16, the active gate structure 1502A has its lower portion wrapping around the corresponding channel layers 420. Such a lower portion of the active gate structure 1502A is separated (or otherwise isolated) from the source/drain structures 1520A and 1520B with a number of inner spacers 802C discretely disposed along sidewalls of this lower portion. Similarly, the active gate structure 1502B has its lower portion wrapping around the corresponding channel layers 420. Such a lower portion of the active gate structure 1502B is separated (or otherwise isolated) from the source/drain structures 1520B and 1520C with a number of inner spacers 802C discretely disposed along sidewalls of this lower portion; and the active gate structure 1502C has its lower portion wrapping around the corresponding channel layers 420. Such a lower portion of the active gate structure 1502C is separated (or otherwise isolated) from the source/drain structures 1520D and 1520E with a number of inner spacers 802C discretely disposed along sidewalls of this lower portion.

The isolation structure 1500, replacing a portion of the channel structure 1501 interposed between the source/drain structures 1520C and 1520D, can then isolate the source/drain structures 1520C and 1520D. Specifically, a number of inner spacers 802I are discretely disposed along sidewalls of the isolation structure 1500. According to various embodiments of the present disclosure, the inner spacers 802I can each have its sidewall, facing the isolation structure 1500, that presents at least one of various profiles as discussed above In one aspect of the present disclosure, a semiconductor device is disclosed. The semiconductor device includes a plurality of first channel layers vertically spaced from one another and a plurality of second channel layers vertically spaced form one another. Each of the plurality of first and second channel layers extend along a first lateral direction. The semiconductor device includes an isolation structure disposed between the plurality of first channel layers and the plurality of second channel layers along a second lateral direction perpendicular to the first lateral direction. The semiconductor device includes a plurality of inner spacers discretely disposed along a first sidewall of the isolation structure that faces toward the first lateral direction, or discretely disposed along a second sidewall of the isolation structure that faces away from the first lateral direction wherein an interface between each of the plurality of inner spacers and the first or second sidewall has a vertical profile.

In another aspect of the present disclosure, a semiconductor device includes a first metal gate structure straddling a first channel structure and a second metal gate structure straddling a second channel structure. The semiconductor device includes an isolation structure disposed between the first and second metal gate structures along a lateral direction perpendicular to a lengthwise direction of the first and second metal gate structures. The semiconductor device includes a pair of first epitaxial structures disposed on opposite sides of the isolation structure, respectively, along the lengthwise direction. The semiconductor device includes a plurality of inner spacers, a first subset of the inner spacers disposed between one of the pair of first epitaxial structures, and a second subset of the inner spacers disposed between the other of the pair of first epitaxial structures, wherein each of the inner spacers has a sidewall interfacing the isolation structure, with a majority portion of the sidewall presenting a vertical profile.

In yet another aspect of the present disclosure, a method for making a semiconductor device is disclosed. The method includes forming a first fin structure, a second fin structure, and a third fin structure over a substrate, wherein the first to third fin structures are disposed in parallel with one another, with the second fin structure disposed between the first and third fin structures. The method includes forming a dummy gate structure straddling the first to third fin structures. The method includes removing portions of the first fin structure, portions of the second fin structure, and portions of the third fin structure not overlaid by the dummy structure to form a first channel structure, a second channel structure, and a third channel structure, respectively. The method includes forming a plurality of first inner spacers discretely disposed along sidewalls of the first channel structure, a plurality of second inner spacers discretely disposed along sidewalls of the second channel structure, and a plurality of third inner spacers discretely disposed along sidewalls of the third channel structure. The method includes forming a plurality of first inner spacers discretely disposed along sidewalls of the first channel structure, a plurality of second inner spacers discretely disposed along sidewalls of the second channel structure, and a plurality of third inner spacers discretely disposed along sidewalls of the third channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of first channel layers vertically spaced from one another, each of the plurality of first channel layers extending along a first lateral direction;
a plurality of second channel layers vertically spaced from one another, each of the plurality of second channel layers extending along the first lateral direction;
an isolation structure disposed between the plurality of first channel layers and the plurality of second channel layers along a second lateral direction perpendicular to the first lateral direction;
a plurality of inner spacers discretely disposed along a first sidewall of the isolation structure that faces toward the first lateral direction, or discretely disposed along a second sidewall of the isolation structure that faces away from the first lateral direction; and
a pair of first epitaxial structures disposed along the first and second sidewalls of the isolation structure, respectively, wherein the pair of epitaxial structures and the isolation structure each have a curvature-based bottom surface;
wherein an interface between each of the plurality of inner spacers and the first or second sidewall has a vertical profile.

2. The semiconductor device of claim 1, wherein the pair of first epitaxial structures are spaced from the first and second sidewalls with a first subset of the inner spacers and a second subset of the inner spacers, respectively.

3. The semiconductor device of claim 1, further comprising:
a first metal gate structure extending along the first lateral direction, wherein the first metal gate structure wraps around each of the first channel layers; and
a second metal gate structure extending along the first lateral direction, wherein the second metal gate structure wraps around each of the second channel layers.

4. The semiconductor device of claim 3, further comprising:
a pair of second epitaxial structures disposed on opposite sides of the first metal gate structure along the first lateral direction, each of the first channel layers connected to the pair of second epitaxial structures; and
a pair of third epitaxial structures disposed on opposite sides of the second metal gate structure along the first lateral direction, each of the second channel layers connected to the pair of third epitaxial structures.

5. The semiconductor device of claim 3, wherein the isolation structure electrically isolates the first metal gate structure and the second metal gate structure.

6. The semiconductor device of claim 1, wherein at least one of the inner spacers has a seam.

7. The semiconductor device of claim 6, wherein a first distance laterally measured from a tip of the seam to the corresponding interface is substantially less than a second distance vertically measured from the seam to a top or bottom surface of the at least one inner spacer.

8. The semiconductor device of claim 6, wherein a first distance laterally measured from a tip of the seam to the corresponding interface is about zero.

9. The semiconductor device of claim 1, wherein each of the inner spacers has a connecting portion between the interface and a top or bottom surface of the inner spacer, the connecting portion being tilted upwardly from the bottom surface or downwardly from the top surface.

10. A semiconductor device, comprising:
a first metal gate structure straddling a first channel structure and extending along a first lateral direction;
a second metal gate structure straddling a second channel structure and extending along a first lateral direction;
an isolation structure disposed between the first and second metal gate structures along a second lateral direction perpendicular to the first lateral direction;
a pair of first epitaxial structures disposed on opposite sides of the isolation structure, respectively, along the second lateral direction; and
a plurality of inner spacers, a first subset of the inner spacers disposed between one of the pair of first epitaxial structures, and a second subset of the inner spacers disposed between the other of the pair of first epitaxial structures;
wherein each of the inner spacers has a sidewall interfacing the isolation structure, with a majority portion of the sidewall presenting a vertical profile,
wherein at least one of the inner spacers has a seam and a first distance laterally measured from a tip of the seam to the corresponding vertical profile is substantially less than a second distance vertically measured from the seam to a top or bottom surface of the at least one inner spacer.

11. The semiconductor device of claim 10, further comprising:
a pair of second epitaxial structures disposed on opposite sides of the first metal gate structure along the second lateral direction; and
a pair of third epitaxial structures disposed on opposite sides of the second metal gate structure along the second lateral direction.

12. The semiconductor device of claim 11, wherein the first metal gate structure, the pair of second epitaxial structure, and the first channel structure collectively function as a first transistor, and the second metal gate structure, the pair of third epitaxial structure, and the second channel structure collectively function as a second transistor, and wherein the first transistor and the second transistor are electrically decoupled from each other with the isolation structure.

13. The semiconductor device of claim 10, wherein the first channel structure comprises one or more first channel layers, with each of the one or more first channel layers wrapped by the first metal structure, and the second channel structure comprises one or more second channel layers, with each of the one or more second channel layers wrapped by the second metal structure.

14. The semiconductor device of claim 10, wherein a first distance laterally measured from a tip of the seam to the corresponding vertical profile is about zero.

15. A method for making semiconductor devices, comprising:
forming a first fin structure, a second fin structure, and a third fin structure over a substrate, wherein the first to third fin structures are disposed in parallel with one another, with the second fin structure disposed between the first and third fin structures;

forming a dummy gate structure straddling the first to third fin structures;

removing portions of the first fin structure, portions of the second fin structure, and portions of the third fin structure not overlaid by the dummy structure to form a first channel structure, a second channel structure, and a third channel structure, respectively;

forming a plurality of first inner spacers discretely disposed along sidewalls of the first channel structure, a plurality of second inner spacers discretely disposed along sidewalls of the second channel structure, and a plurality of third inner spacers discretely disposed along sidewalls of the third channel structure; and removing a portion of the dummy gate structure and the whole second channel structure, while concurrently shaping sidewalls of the plurality of second inner spacers, thereby forming a cavity.

16. The method of claim 15, prior to the step of removing a portion of the dummy gate structure and the second channel structure, further comprising:

forming a pair of first epitaxial structures on opposite sides of the first channel structure, a pair of second epitaxial structures on opposite sides of the second channel structure, and a pair of third epitaxial structures on opposite sides of the third channel structure; and overlaying, with a first dielectric material, the pair of first epitaxial structures, the pair of second epitaxial structures, and the pair of third epitaxial structures.

17. The method of claim 15, further comprising:

filling the cavity with a second dielectric material; and replacing portions of the dummy gate structure that are disposed on opposite sides of the isolation structure with a first metal gate structure and a second metal gate structure, respectively.

* * * * *